(12) United States Patent
Yagishita et al.

(10) Patent No.: US 8,253,498 B2
(45) Date of Patent: Aug. 28, 2012

(54) PHASE LOCKED LOOP WITH DIVIDER BIAS CONTROL

(75) Inventors: Yuki Yagishita, Kanangawa (JP);
Yasunori Tsukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 11 days.

(21) Appl. No.: 12/929,774

(22) Filed: Feb. 15, 2011

(65) Prior Publication Data

US 2011/0215875 A1 Sep. 8, 2011

(30) Foreign Application Priority Data

Mar. 8, 2010 (JP) ................................. 2010-050513

(51) Int. Cl.
*H03L 7/00* (2006.01)
(52) U.S. Cl. ......... 331/16; 331/34; 331/1 A; 331/177 R; 327/156; 327/159
(58) Field of Classification Search ............. 331/1 A, 331/16, 34, 177 R; 327/156, 159
See application file for complete search history.

(56) References Cited

U.S. PATENT DOCUMENTS 5,334,953 A * 8/1994 Mijuskovic .................. 331/8
7,274,229 B1 * 9/2007 Humphreys et al. .......... 327/156

FOREIGN PATENT DOCUMENTS

JP 2006-180349 7/2006

* cited by examiner

*Primary Examiner* — Arnold Kinkead
(74) *Attorney, Agent, or Firm* — Rader, Fishman & Grauer PLLC; Christopher M. Tobin

(57) ABSTRACT

A phase-locked loop circuit includes: a phase and frequency comparing section configured to compare a phase of an external reference clock signal with a phase of a comparison clock signal, and generate an error signal corresponding to a result of comparison; an oscillating section configured to generate an internal clock signal of an oscillation frequency corresponding to the error signal; a frequency dividing section configured to generate the comparison clock signal by frequency-dividing the internal clock signal by a predetermined frequency dividing ratio; an oscillator control section configured to generate an oscillation control signal for controlling frequency of the internal clock signal output from the oscillating section on a basis of the error signal; and a frequency divider control section configured to generate a frequency division control signal for controlling a bias current of the frequency dividing section on a basis of the error signal.

20 Claims, 14 Drawing Sheets

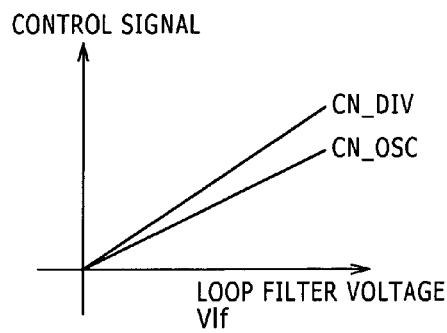
FIG. 6A
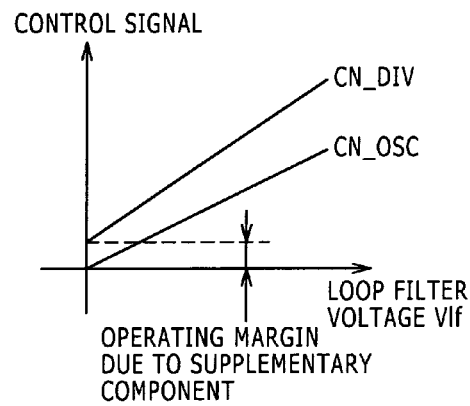
FIG. 6B
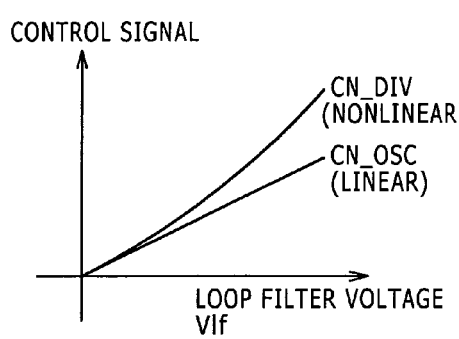
FIG. 6C
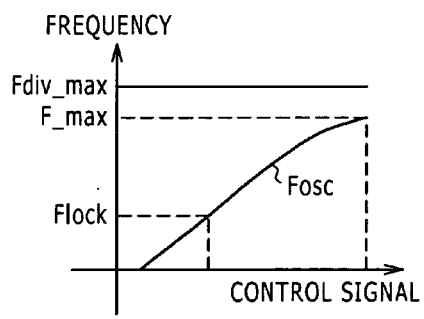
FIG. 6D
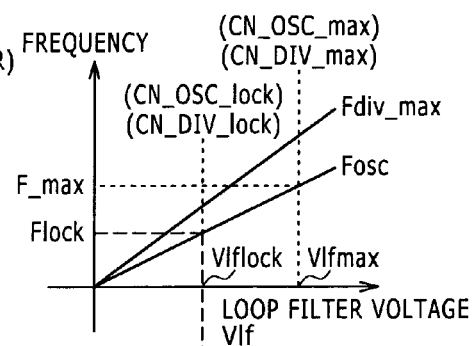
FIG. 6E
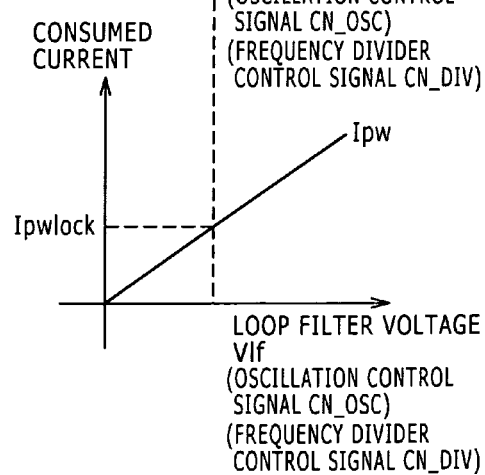

NMOS OUTPUT

PMOS OUTPUT

PMOS OUTPUT

NMOS OUTPUT

PMOS OUTPUT

NMOS OUTPUT

PMOS OUTPUT

NMOS OUTPUT

NMOS OUTPUT

PMOS OUTPUT

NMOS OUTPUT

PMOS OUTPUT

PHASE LOCKED LOOP WITH DIVIDER BIAS CONTROL

BACKGROUND OF THE INVENTION

1. Field of the Invention

The present invention relates to a phase-locked loop (PLL) circuit, a semiconductor integrated circuit, an electronic device, and a control method of a phase-locked loop circuit, and particularly to an improvement in control response in a phase-locked loop circuit.

2. Description of the Related Art

A phase-locked loop circuit (that may be referred to also as a phase-locked circuit) may be incorporated into an electronic device.

An ordinary phase-locked loop circuit generates an internal clock signal of a desired oscillation frequency in synchronism with an external reference clock signal. Specifically, the phases and frequencies of the external reference clock signal and an internally generated comparison clock signal are compared with each other by a phase and frequency comparator. A phase-difference signal corresponding to a result of the comparison is supplied to a loop filter section to extract a low-frequency component of the phase-difference signal and set the low-frequency component as an oscillation control signal. The oscillation control signal output from the loop filter section is supplied to an oscillator (a voltage controlled oscillator or a current controlled oscillator). The oscillator generates an internal clock signal of an oscillation frequency corresponding to the oscillation control signal, and supplies the internal clock signal to a frequency divider. The frequency divider generates a comparison clock signal by frequency-dividing the internal clock signal generated by the oscillator by a predetermined frequency dividing ratio, and supplies the comparison clock signal to the phase and frequency comparator.

Japanese Patent Laid-Open No. 2006-180349 (hereinafter referred to as Patent Document 1) proposes a mechanism that enables a state of operation of a phase-locked loop circuit to be determined accurately on the basis of an output signal of a phase and frequency comparator.

In the mechanism described in Patent Document 1, an operation state determining section determines whether a PLL frequency synthesizer is in a desired operation state on the basis of whether a control voltage output from a loop filter is within a predetermined voltage range. A current control circuit generates a frequency division control signal for controlling a frequency divider on the basis of a determination signal from the operation state determining section. At this time, the current control circuit generates the frequency division control signal so as to reduce the driving current of the frequency divider within a range where the PLL frequency synthesizer maintains the desired operation state.

With such a mechanism, the state of operation of the PLL frequency synthesizer can be determined accurately, and the erroneous operation of the feedback frequency dividing circuit can be detected. Further, the power consumption of the frequency divider and the PLL frequency synthesizer can be reduced by providing the current control circuit.

SUMMARY OF THE INVENTION

However, with the mechanism described in Patent Document 1, the operation state determining section is formed by an analog/digital converter, a memory circuit, and a determining circuit. The constitution of the operation state determining section is a special circuit configuration, and has a complex signal processing system. This causes a difference in control response between an oscillation control signal for controlling an oscillator and the frequency division control signal for controlling the frequency divider.

The present invention has been made in view of the above situation. It is desirable to provide a mechanism that can reduce a difference in control response between an oscillator and a frequency divider in a phase-locked loop circuit.

In addition, it is desirable to provide a mechanism that can reduce the scale and power consumption of a circuit for generating a frequency division control signal for controlling a frequency divider.

A phase-locked loop circuit according to an embodiment of the present invention includes: a phase and frequency comparing section configured to compare a phase of an external reference clock signal with a phase of a comparison clock signal, and generate an error signal corresponding to a result of comparison; an oscillating section configured to generate an internal clock signal of an oscillation frequency corresponding to the error signal; a frequency dividing section configured to generate the comparison clock signal by frequency-dividing the internal clock signal by a predetermined frequency dividing ratio; an oscillator control section configured to generate an oscillation control signal for controlling frequency of the internal clock signal output from the oscillating section on a basis of the error signal; and a frequency divider control section configured to generate a frequency division control signal for controlling a bias current of the frequency dividing section on a basis of the error signal.

Further, in a first mode of the present invention, the oscillator control section and the frequency divider control section are configured such that the oscillation control signal and the frequency division control signal respond having a predetermined relation to each other on a basis of the error signal both in a pull-in process and at a time of locking.

Alternatively, in a second mode of the present invention, the oscillator control section and the frequency divider control section are configured such that the oscillating section and the frequency dividing section perform interlocked operation on a basis of the error signal both in a pull-in process and at a time of locking.

The first mode of the present invention defines a mechanism according to an embodiment of the present invention from an aspect of relation between the control signals. The second mode of the present invention defines a mechanism according to an embodiment of the present invention from an aspect of control operation.

When the oscillation control signal and the frequency division control signal respond having a predetermined relation to each other on a basis of the error signal both in a pull-in process and at a time of locking, the oscillating section and the frequency dividing section perform interlocked operation on the basis of the error signal. This reduces a difference in control response between the oscillating section and the frequency dividing section in the phase-locked loop circuit. In addition, a circuit configuration for making the interlocked operation performed is simpler than that described in Patent Document 1.

In addition, preferably, relation of the oscillation control signal and the frequency division control signal to the error signal is set properly. "Properly" means "so as to have a predetermined correlation." For example, relation between the control signals is set such that the maximum operating frequency of the frequency dividing section which frequency corresponds to an arbitrary value of the error signal both in a pull-in process and at a time of locking is always higher than the frequency of the internal clock signal output from the oscillating section. In this case, the frequency division control signal at the time of locking automatically sets, in the frequency dividing section, a bias current lower than a bias current based on a loop filter signal corresponding to the maximum frequency of the internal clock signal output from the oscillator in the pull-in process. Thereby power consumption at the time of locking can be reduced as compared with cases where the present invention is not applied.

According to the present invention, it is possible to reduce a difference in control response between the oscillator and the frequency divider in the phase-locked loop circuit, and make a circuit scale smaller than that of Patent Document 1.

In addition, by properly setting the relation of the oscillation control signal and the frequency division control signal to the error signal, power consumption at the time of locking can be reduced as compared with cases where the present invention is not applied.

BRIEF DESCRIPTION OF THE DRAWINGS

FIGS. 6A, 6B, 6C, 6D, and 6E are diagrams of assistance in explaining an example of the control responses of the oscillating section and the frequency dividing section;

FIGS. 7A-1, 7A-2, 7B-1, 7B-2, 7C, and 7D are diagrams (1) of assistance in explaining a first example of the voltage-to-current converting circuit;

FIGS. 11A-1, 11A-2, and 11B are diagrams of assistance in explaining a fourth example of the voltage-to-current converting circuit;

FIGS. 13A-1, 13A-2, and 13B are diagrams of assistance in explaining a sixth example of the voltage-to-current converting circuit.

DETAILED DESCRIPTION OF THE PREFERRED EMBODIMENTS

Preferred embodiments of the present invention will hereinafter be described in detail with reference to the drawings. When each functional element is distinguished by form, the functional element will be described with a capital reference in English such as A, B, C, . . . attached thereto. The reference will be omitted when each functional element is described without being particularly distinguished. The same is true for the drawings.

Figure 1A:
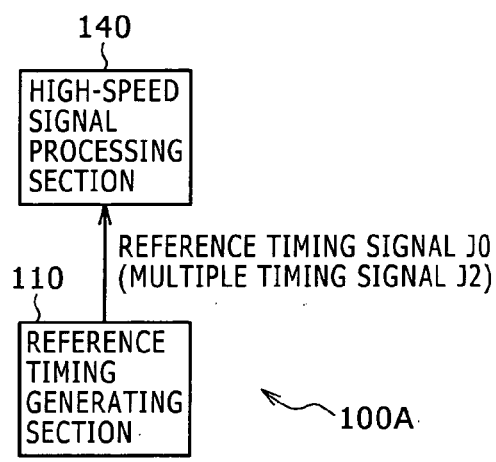
FIGS. 1A and 1B are diagrams of assistance in explaining the general configuration of a timing generating circuit as an example of an electronic circuit to which one embodiment of the present invention is applied.
Figure 1B:
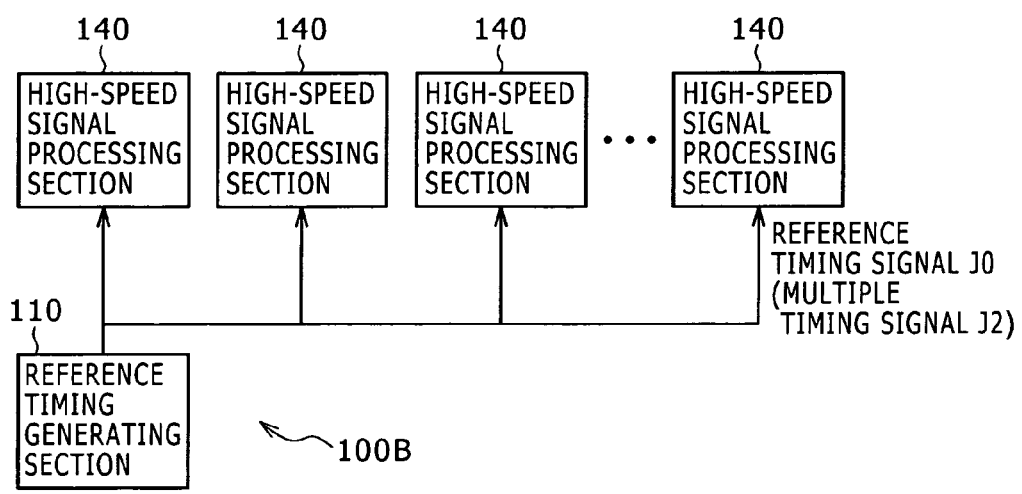

The description will be given below under the following headings.
1. General Configuration of Timing Generating Circuit
2. Reference Timing Generating Section (Basic Configuration, Oscillating Section, and Frequency Dividing Section)
3. Relation between Control Responses of Oscillating Section and Frequency Dividing Section
4. Voltage-to-Current Converting Section: First Example
5. Voltage-to-Current Converting Section: Second Example
6. Voltage-to-Current Converting Section: Third Example
7. Voltage-to-Current Converting Section: Fourth Example
8. Voltage-to-Current Converting Section: Fifth Example
9. Voltage-to-Current Converting Section: Sixth Example
10. Comparison with Comparative Example
11. Examples of Application to Electronic Devices General Configuration FIGS. 1A and 1B are diagrams of assistance in explaining the general configuration of a timing generating circuit as an example of an electronic circuit or a semiconductor integrated circuit to which one embodiment of the present invention is applied. A timing generating circuit 100 includes a reference timing generating section 110 using a phase-locked loop circuit and a signal processing section 140.

A timing generating circuit 100A in a first example of basic configuration shown in FIG. 1A includes a single signal processing section 140.

A timing generating circuit 100B in a second example of basic configuration shown in FIG. 1B includes a plurality of signal processing sections 140. One reference timing generating section 110 is commonly provided for the plurality of signal processing sections 140. The general configuration is made compact by allowing the reference timing generating section 110 to be shared by the plurality of signal processing sections 140 (all the signal processing sections 140 in this example). It suffices for the reference timing generating section 110 to be shared by a plurality of signal processing sections 140. It is not essential that all the signal processing sections 140 share the reference timing generating section 110. The configuration may include a plurality of reference timing generating circuits 110. In that case, however, a circuit scale is correspondingly increased.

The signal processing section 140 may be a high-speed signal processing section circuit desired to perform higher-speed signal processing, may be a standard signal processing section for performing signal processing not desired to be high-speed processing, or may have a configuration in which a high-speed signal processing section circuit and a standard signal processing section coexist with each other.

"High-speed signal processing" in the present specification means that the toggle frequency (frequency) of a signal output from the signal processing section 140 is higher than the toggle frequency (frequency) of an output clock output from the reference timing generating section 110.

The high-speed signal processing section is a functional block or a circuit section achieving a function desired to be high-speed processing. A high-speed parallel-to-serial converter circuit or a high-speed serial-to-parallel converter circuit, for example, corresponds to the high-speed signal processing section.

On the other hand, the standard signal processing section is a circuit section operating on the basis of a reference timing signal J0 from the reference timing generating section 110, and is an example of a low-speed signal processing section performing lower-speed digital signal processing than the high-speed signal processing section. In other words, the standard signal processing section is a functional block or a circuit section achieving a function desired to be processing at a standard speed rather than high speed.

The reference timing generating section 110 generates the reference timing signal J0 to be supplied to the signal processing section 140 which timing signal serves as a reference for the entire system. It suffices for the reference timing generating section 110 to generate the reference timing signal J0. The reference timing generating section 110 can employ various circuit configurations. In the present embodiment, however, the reference timing generating section 110 is formed by a PLL (Phase-Locked Loop).

When the signal processing section 140 is a high-speed signal processing section, the reference timing signal J0 is timing information serving as a reference for performing high-speed processing in the signal processing section 140. However, each of timing signals forming the reference timing signal J0 in this case has a lower toggle frequency than the toggle frequency of the signal output from the signal processing section 140. The reference timing signal J0 will be referred to specifically as a "multiphase timing signal J2."

More specifically, the multiphase timing signal J2 has a plurality of clock phases from a combination of a plurality of clock signals. In other words, while each clock signal has a low frequency, high-speed timing information as a whole obtained by combining the phases of respective clock signals with each other can be supplied as the multiphase timing signal J2 to the signal processing section 140 performing high-speed processing. The multiphase timing signal J2 is formed by a plurality of clock signals having phase relation needed on the side of the high-speed signal processing section 140. Typically, the multiphase timing signal J2 is formed by a plurality of clock signals of different phases at equal intervals. For example, differential output of oscillator elements in respective stages forming the reference timing generating section 110 may be used as a plurality of clock signals.

The oscillating circuit used in the phase-locked loop circuit of the reference timing generating section 110 can employ various circuit configurations. However, the oscillating circuit is preferably formed by an oscillating circuit composed of a ring buffer, a delay line composed of a delay-controlled buffer chain, or the like. An example of the oscillating circuit will be described later.

Reference Timing Generating Circuit

[Basic Configuration]

Figure 2:
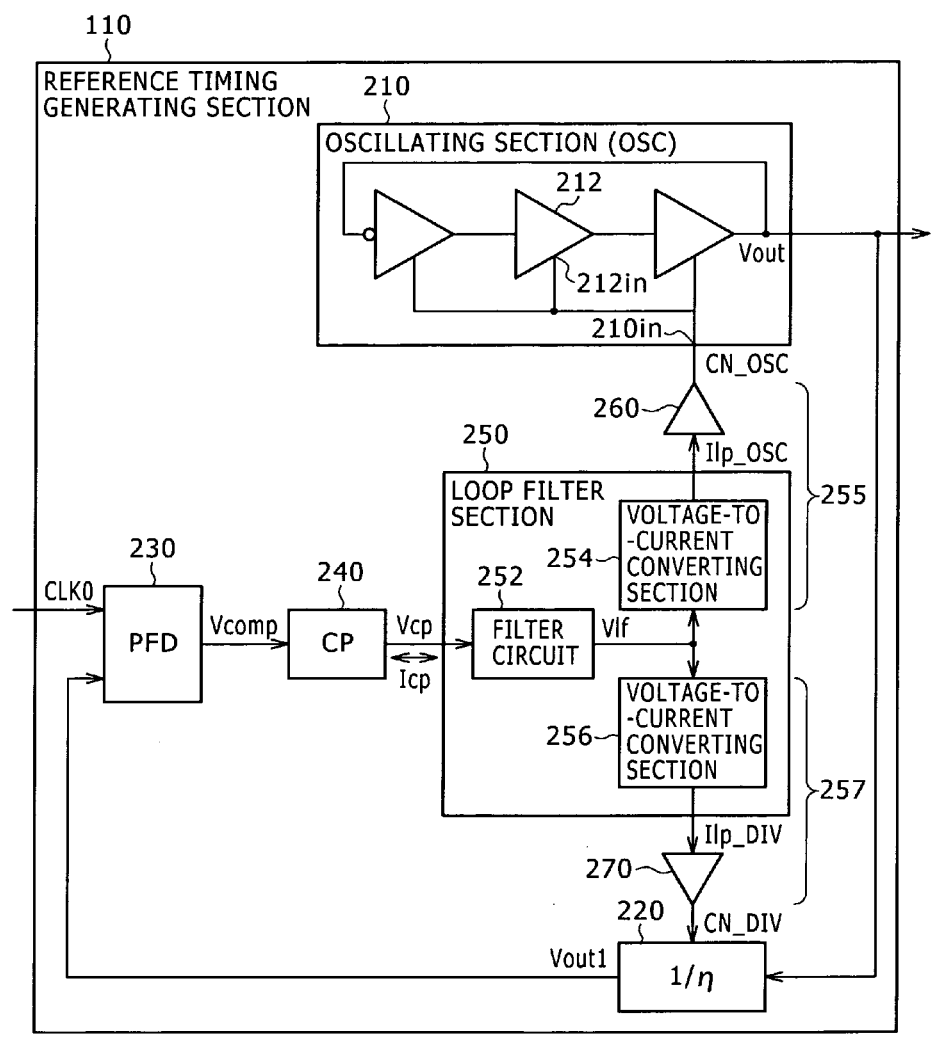
FIG. 2 is a diagram of assistance in explaining a basic configuration of a reference timing generating section.

FIG. 2 is a diagram of assistance in explaining a basic configuration of the reference timing generating section 110. The reference timing generating section 110 has a configuration using a phase-locked loop circuit (PLL). The reference timing generating section 110 may be provided as a semiconductor integrated circuit, for example.

The reference timing generating section 110 includes an oscillating section 210 (OSC), a frequency dividing section 220 (feedback frequency divider), a phase and frequency comparing section 230 (PFD), a charge pump 240 (CP), a loop filter section 250, a buffer section 260, and a buffer section 270.

Either of a voltage controlled oscillating circuit (VCO) and a current controlled oscillating circuit (CCO) may be used as the oscillating section 210. The following description will be made supposing that a current controlled oscillating circuit is used as the oscillating section 210 unless otherwise specified.

The oscillating section 210 formed by a current controlled oscillating circuit uses an oscillating circuit formed by a ring buffer in which stages of a plurality of oscillators are cascaded into an annular structure. Specifically, a plurality of unit delay elements 212 (which elements are referred to also as delay cells or delay stages) are cascaded as stages of a plurality of oscillators. In this case, as an example, three unit delay elements 212 are used, and buffer circuits are used as the unit delay elements 212. When a unit delay element 212 in a ζth stage is to be distinguished, the unit delay element 212 in the ζth stage will be described with a reference ζ added to the unit delay element 212 in the ζth stage. The same is true when a stage number or the like of another constituent element to be described later is distinguished.

The oscillating section 210 as a whole forms a ring oscillator. For example, the oscillating section 210 has a negative feedback connection, and effects positive feedback with a phase shift due to an internal RC component (a resistive component and a capacitive component) during operation. For example, the unit delay elements 212 are arranged in a cascaded manner, and the output signal of a unit delay element 212 in one of the stages (usually in the last stage) is returned to the input of the unit delay element 212 in the first stage. Differential clock signals are output from the respective unit delay elements 212 of the oscillating section 210 in the reference timing generating section 110, and these differential clock signals are supplied to the unit delay elements 212 in subsequent stages. To explicitly show the "negative feedback connection," the symbol O of "inverting input" is shown attached to the input of a unit delay element 212 in one of the stages (first stage as an example).

It suffices for each unit delay element 212 (buffer circuit) to be of a configuration capable of delay control. For example, it suffices for each unit delay element 212 to be formed by a differential circuit using two transistors (for example field effect transistors). As will be described later, for example, the gate of one transistor is set as a non-inverting input, the drain of the transistor is connected to a first reference potential via a resistive element, and the drain of the transistor is set as an inverting output. In addition, the gate of another transistor is set as an inverting input, the drain of the transistor is connected to the first reference potential via a resistive element, and the drain of the transistor is set as a non-inverting output. In addition, the sources of the transistors are connected to each other, and are connected to a second reference potential via a current source of a variable current value type.

The current source of the variable current value type receives an oscillation control signal CN_OSC (=a loop filter output current Ilp passed through the buffer section 260) supplied to a control input terminal 212 in in a current mirror form (a mirror ratio of 1:1 suffices), and supplies a bias current to the transistors. By controlling the bias current of the differential circuits by the current source of the variable current value type, an amount of delay by each unit delay element 212 is controlled, and the oscillation frequency of the oscillating section 210 as a whole is controlled.

The control input terminals 212 in of the respective unit delay elements 212 are connected to a common frequency control input terminal 210in. The loop filter output current Ilp (specifically the loop filter output current Ilp passed through the buffer section 260) supplied to the control input terminals 212 in via the frequency control input terminal 210in is used as the oscillation control signal CN_OSC.

The oscillation control signal CN_OSC is an oscillation control current Icco when the oscillating section 210 is a current controlled oscillating circuit, and oscillation frequency Fosc in this case is an oscillation frequency Fcco. The oscillation control signal CN_OSC is an oscillation control voltage Vvco when the oscillating section 210 is a voltage controlled oscillating circuit, and the oscillation frequency Fosc in this case is an oscillation frequency Fvco.

The frequency dividing section 220 is provided in a case where a multiplying function is realized. The frequency dividing section 220 obtains a frequency-divided oscillating signal Vout1 as an example of a comparison clock signal by frequency-dividing the oscillation frequency Fcco of an output oscillating signal Vout as an example of an internal clock signal output from the output terminal of the oscillating section 210 into $1/\eta$. $\eta$ is a PLL multiplication factor (referred to also as a frequency dividing ratio), is a positive integer of one or more, and is desirably made variable to be able to change the frequency of a PLL output clock CK_PLL.

The phase and frequency comparing section 230 compares the phases and frequencies of an externally supplied reference clock and the frequency-divided oscillating signal Vout1 from the frequency dividing section 220 with each other. The phase and frequency comparing section 230 outputs an error signal indicating a phase difference and a frequency difference as a result of the comparison as a comparison result signal Vcomp. The reference clock externally supplied to one input terminal of the phase and frequency comparing section 230 will be referred to as an external reference clock CLK0. Another signal supplied to another input terminal of the phase and frequency comparing section 230 is the frequency-divided oscillating signal Vout1 as an example of the comparison clock signal.

The charge pump 240 receives or outputs a driving current (referred to as a charge pump current Icp) corresponding to the comparison result signal Vcomp output from the phase and frequency comparing section 230. The charge pump 240 includes for example a charge pump for receiving or outputting the charge pump current Icp corresponding to the comparison result signal Vcomp output from the phase and frequency comparing section 230 and a current source of a variable current value type for supplying a bias current Icp-bias to the charge pump.

The loop filter section 250 is an example of a smoothing section for smoothing the comparison signal output from the phase and frequency comparing section 230 via the charge pump 240. The loop filter section 250 may be of either of a current output type and a voltage output type. FIG. 2 shows an example of a current output type. The loop filter section 250 includes for example a low-pass filter as a filter circuit 252. The loop filter section 250 integrates the charge pump current Icp generated by the charge pump 240 by the filter circuit 252, and generates a loop filter output current Ilp for controlling the oscillation frequency Fcco of the oscillating section 210.

The loop filter section 250 has a configuration capable of current output so as to be adapted to the oscillating section 210 formed by a current controlled oscillating circuit. That is, in order to be of a current output type, the loop filter section 250 specifically includes a voltage-to-current converting section 254 and a voltage-to-current converting section 256 in a stage subsequent to the filter circuit 252. The voltage-to-current converting section 254 and the buffer section 260 form an oscillator controlling section 255. The voltage-to-current converting section 256 and the buffer section 270 form a frequency divider controlling section 257. When the loop filter section 250 is of a voltage output type, the voltage-to-current converting section 254 and the voltage-to-current converting section 256 do not need to be provided in the stage subsequent to the filter circuit 252.

Incidentally, while the voltage-to-current converting section 254 and the voltage-to-current converting section 256 are shown included within the loop filter section 250 in FIG. 2, the loop filter section 250 may be treated as a loop filter section having only the filter circuit 252, and the voltage-to-current converting section 254 and the voltage-to-current converting section 256 may be considered to be arranged outside the loop filter section 250.

Specifically, suppose that the loop filter section 250 includes the filter circuit 252 having a capacitor (capacitive element) of a loop filter capacitance Cp, includes a voltage-to-current converting circuit (transconductance) with a voltage-to-current conversion gain Gm_OSC as the voltage-to-current converting section 254, and includes a voltage-to-current converting circuit (transconductance) with a voltage-to-current conversion gain Gm_DIV as the voltage-to-current converting section 256.

The output of the charge pump is commonly connected to one terminal of the capacitor and the inputs of the voltage-to-current converting section 254 and the voltage-to-current converting section 256. Another terminal of the capacitor is connected to a reference potential (for example a ground or a power supply).

In the loop filter section 250, a voltage signal (referred to as a charge pump voltage Vcp) is generated at one terminal of the capacitor (that is, the inputs of the voltage-to-current converting sections) on the basis of the charge pump current Icp output from the charge pump.

Because an operation of charging or discharging the capacitor is performed, the loop filter section 250 (the filter circuit 252 of the loop filter section 250) functions as a low-pass filter exhibiting at least one cutoff frequency (pole) so as to attenuate a frequency component higher than a predetermined cutoff frequency (referred to also as a roll-off frequency or a pole) in the comparison result signal Vcomp from the phase and frequency comparing section 230, and smooth the oscillation control current Icco to be supplied to the oscillating section 210 and extract the low-frequency component of the oscillation control current Icco.

Incidentally, the function of the filter circuit 252 as low-pass filter may be enhanced by connecting not only the capacitor but a resistive element of a loop filter resistance Rp in series. When a configuration including one charge pump is adopted, a configuration including the resistive element is generally adopted. In addition, a modification is conceivable in which a plurality of poles of transfer characteristics are provided by connecting a single circuit of a capacitor and a series circuit of a capacitor and a resistive element in parallel with each other, for example.

The voltage-to-current converting section 254 and the voltage-to-current converting section 256 convert a loop filter voltage Vlf (charge pump voltage Vcp in this example) generated at one terminal of the capacitor of the filter circuit 252 (that is, the inputs of the voltage-to-current converting sections) on the basis of the charge pump current Icp output from the charge pump into a current signal (loop filter output current Ilp) according to a voltage-to-current conversion gain Gm.

A loop filter output current Ilp_OSC is used as the oscillation control signal CN_OSC for the oscillating section 210 by being passed through the buffer section 260. A loop filter output current Ilp_DIV is used as a frequency division control signal CN_DIV for controlling the frequency dividing section 220 by being passed through the buffer section 270. In other words, each loop filter output current Ilp is a control signal serving as a basis for the oscillation control signal CN_OSC and the frequency division control signal CN_DIV.

The buffer section 260 is a functional part forming an interface for the oscillation control signal between the loop filter section 250 (voltage-to-current converting section 254 in this example) and the oscillating section 210. The buffer section 260 is formed by a current-to-current converting circuit functioning as a current buffer, for example. The current-to-current converting circuit has a function of converting the loop filter output current Ilp from the loop filter section 250 to K_OSC times the loop filter output current Ilp (K_OSC is a mirror ratio, which is an arbitrary value including one, and may be larger than one or may be smaller than one).

It suffices to provide the buffer section 260 as required according to a need for the folding of a current direction, a setting of the mirror ratio K_OSC, and the like. The buffer section 260 is not an essential constituent element, but it suffices to provide the buffer section 260 as required. For example, when the mirror ratio K_OSC may be "1," and the loop filter output current Ilp_OSC may be used as the oscillation control current Icco as it is, the buffer section 260 does not need to be provided. On the other hand, for example, when the mirror ratio K_OSC is set to other than "1," and a steady-state value (constant-current component in this example) is superimposed on a control signal (control current in this example) based on the loop filter output current Ilp_OSC irrespective of the mirror ratio K_OSC, the buffer section 260 is provided. Incidentally, the functions of the buffer section 260 may be incorporated into the voltage-to-current converting section 254.

Incidentally, in the case where the loop filter section 250 is of a voltage output type, a so-called voltage follower having a voltage gain G_OSC of "1" as a buffer function for the loop filter voltage Vlf may be provided as the buffer section 260. In addition, in the case where the loop filter section 250 is of a voltage output type, when the voltage gain G_OSC is set to other than "1," and a steady-state value (constant-voltage component in this example) is superimposed on a control signal (control voltage in this example) based on a loop filter output voltage Vlp_OSC irrespective of the voltage gain G_OSC, the buffer section 260 may be provided.

The buffer section 270 is a functional part performing an interface function for the frequency division control signal between the loop filter section 250 (voltage-to-current converting section 256 in this example) and the frequency dividing section 220. The buffer section 270 is formed by a current-to-current converting circuit functioning as a current buffer, for example. The current-to-current converting circuit has a function of converting the loop filter output current Ilp from the loop filter section 250 to K_DIV times the loop filter output current Ilp (K_DIV is a mirror ratio, which is an arbitrary value including one, and may be larger than one or may be smaller than one).

It suffices to provide the buffer section 270 as required according to a need for the folding of a current direction, a setting of the mirror ratio K_DIV (finger ratio), and the like. The buffer section 270 is not an essential constituent element, but it suffices to provide the buffer section 270 as required. For example, when the mirror ratio K_DIV may be "1," and the loop filter output current Ilp_DIV may be used as the frequency division control signal CN_DIV as it is, the buffer section 270 does not need to be provided. On the other hand, for example, when the mirror ratio K_DIV is set to other than "1," and a steady-state value (constant-current component in this example) is superimposed on a control signal (control current in this example) based on the loop filter output current Ilp_DIV irrespective of the mirror ratio K_DIV, the buffer section 270 is provided. Incidentally, the functions of the buffer section 270 may be incorporated into the voltage-to-current converting section 256.

Incidentally, in the case where the oscillating section 210 is a voltage controlled oscillator, and the loop filter section 250 is of a voltage output type, a so-called voltage follower having a voltage gain G_DIV of "1" as a buffer function for the loop filter voltage Vlf may be provided as the buffer section 270. In addition, in a similar case, when the voltage gain G_DIV is set to other than "1," and a steady-state value (constant-voltage component in this example) is superimposed on a control signal (control voltage in this example) based on a loop filter output voltage Vlp_DIV irrespective of the voltage gain G_DIV, the buffer section 270 may be provided.

[Oscillating Section: Current Controlled Oscillating Circuit]

Figure 3A:
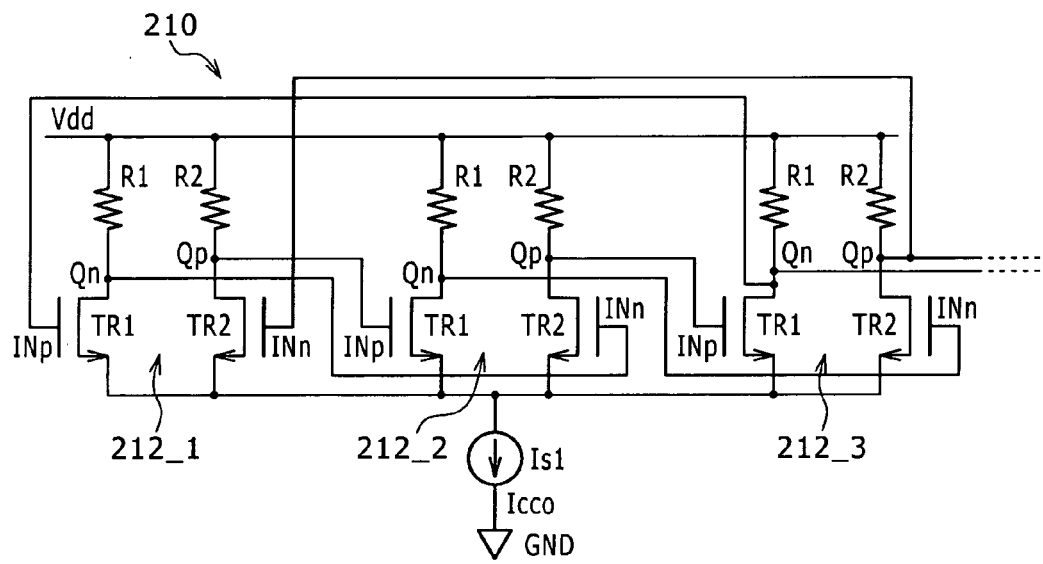
FIGS. 3A and 3B are diagrams of assistance in explaining an example of configuration of an oscillating section.
Figure 3B:
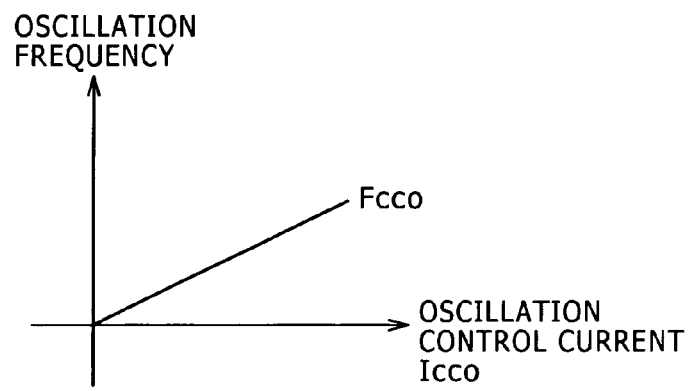

FIGS. 3A and 3B are diagrams of assistance in explaining an example of configuration of the oscillating section 210 in the reference timing generating section 110. In this case, the oscillating section 210 is a current controlled oscillating circuit. Incidentally, FIG. 3A is a detailed circuit diagram, and FIG. 3B shows an example of the characteristic of the oscillation frequency Fcco with respect to the oscillation control current Icco.

As shown in FIG. 3A, the unit delay elements 212 of the oscillating section 210 formed by a current controlled oscillating circuit are each formed by a differential circuit using a transistor TR1 and a transistor TR2 as two NMOSs (N-type MOS transistors). The gate of the transistor TR1 is set as a non-inverting input INp, the drain of the transistor TR1 is connected to a power supply Vdd via a resistive element R1, and the drain of the transistor TR1 is set as an inverting output Qn. In addition, the gate of the transistor TR2 is set as an inverting input INn, the drain of the transistor TR2 is connected to the power supply Vdd via a resistive element R2, and the drain of the transistor TR2 is set as a non-inverting output Qp.

In the present example, the inverting output Qn of the unit delay element 212_1 in the first stage is connected to the inverting input INn of the unit delay element 212_2 in the second stage, and the non-inverting output Qp in the first stage is connected to the non-inverting input INp in the second stage. Further, the inverting output Qn of the unit delay element 212_2 in the second stage is connected to the inverting input INn of the unit delay element 212_3 in the third stage, and the non-inverting output Qp in the second stage is connected to the non-inverting input INp in the third stage. Further, the inverting output Qn of the unit delay element 212_3 in the third stage is connected to the non-inverting input INp of the unit delay element 212_1 in the first stage, and the non-inverting output Qp in the third stage is connected to the inverting input INn in the first stage. Thereby, a negative feedback connection is made, and a ring oscillator is formed as a whole.

The sources of the transistor TR1 and the transistor TR2 in each stage are connected to each other, and are further connected to a reference potential (for example a ground potential GND) via a current source Is1 of a variable current value type.

The current source Is1 is controlled by the oscillation control current Icco as the oscillation control signal CN_OSC from the oscillator control section 255. Alternatively, the current source Is1 may be incorporated into the voltage-to-current converting section 254 or the buffer section 260. In this case, the output current of the current source Is1 is the oscillation control current Icco itself as the oscillation control signal CN_OSC.

FIG. 3B shows an example of the characteristic of the oscillation frequency Fcco with respect to the oscillation control current Icco of the current controlled oscillator. In this example, the oscillation frequency Fcco monotonically increases with the oscillation control current Icco, and in particular, the oscillation frequency Fcco increases substantially in proportion to the oscillation control current Icco.

[Frequency Dividing Section: Current Receiving Type]

Figure 4A:
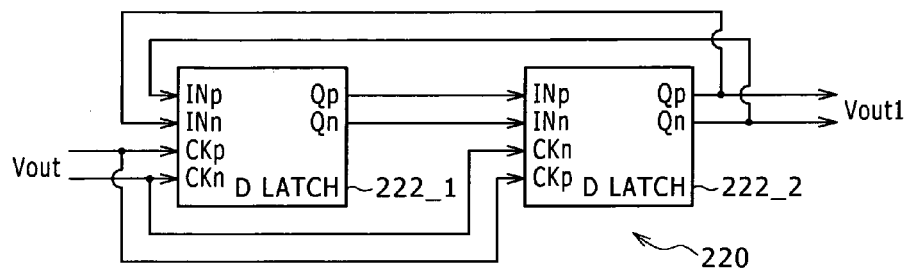
FIGS. 4A, 4B, 4C, and 4D are diagrams of assistance in explaining an example of configuration of a frequency dividing section.
Figure 4B:
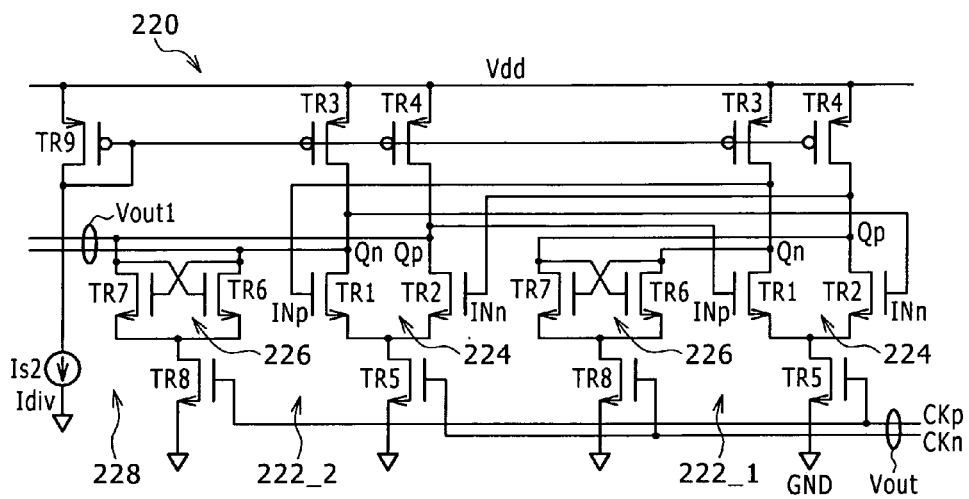
Figure 4C:
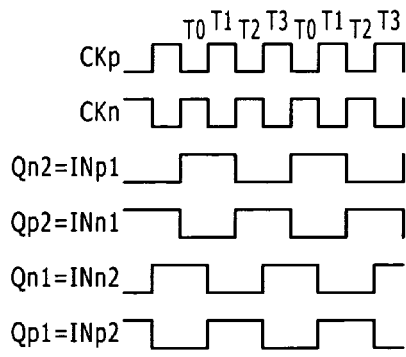
Figure 4D:
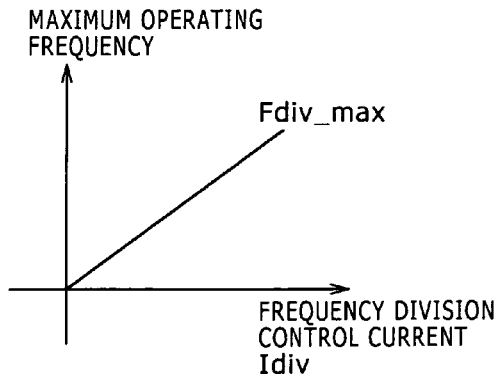

FIGS. 4A to 4D are diagrams of assistance in explaining an example of configuration of the frequency dividing section 220 in the reference timing generating section 110. In this case, the control input terminal of the frequency dividing section 220 is of a current receiving type. Incidentally, FIG. 4A is a functional block diagram, FIG. 4B is a detailed circuit diagram, FIG. 4C is a timing chart showing an example of operation, and FIG. 4D shows an example of the characteristic of a maximum operating frequency Fdiv_max with respect to the frequency division control current Idiv.

As shown in FIG. 4A, as an example, the frequency dividing section 220 is formed by a divide-by-2 frequency divider circuit (prescaler) using two D latches 222 (D-type flip-flops). The D latches 222 in respective stages are alternately supplied with a non-inverted clock CKp and an inverted clock CKn having a complementary relation to each other, the non-inverted clock CKp and the inverted clock CKn being the output oscillating signal Vout output from the oscillating section 210.

"Alternately" means that, for example, the D latch 222_1 in the first stage takes in data in an H-level period of the non-inverted clock CKp, and retains the taken-in data in an H-level period of the inverted clock CKn, while the D latch 222_2 in the second stage takes in data in an H-level period of the inverted clock CKn, and retains the taken-in data in an H-level period of the non-inverted clock CKp.

The non-inverting output Qp of the D latch 222_1 in the first stage is connected to the non-inverting input INp of the D latch 222_2 in the second stage, and the inverting output Qn of the D latch 222_1 in the first stage is connected to the inverting input INn of the D latch 222_2 in the second stage. Further, the non-inverting output Qp of the D latch 222_2 in the second stage is connected to the inverting input INn of the D latch 222_1 in the first stage, and the inverting output Qn of the D latch 222_2 in the second stage is connected to the non-inverting input INp of the D latch 222_1 in the first stage. Thereby, a differential input-output configuration is formed as a whole, and the non-inverting output Qp and the inverting output Qn in the second stage outputs the frequency-divided oscillating signal Vout1.

As shown in FIG. 4B, the D latches 222 of the frequency dividing section 220 include a data take-in circuit 224, a data retaining circuit 226, and a bias circuit 228.

The data take-in circuit 224 is a so-called active load provided with a differential circuit using two NMOSs (N-type MOS transistors) and having PMOSs (P-type MOS transistors) as a load. Specifically, a transistor TR1 and a transistor TR2 are differential-connected to each other, and a transistor TR3 and a transistor TR4 are connected as the load (drain side).

The transistor TR1 has a gate as a non-inverting input INp, and has a drain thereof connected to the drain of the transistor TR3, the drain of the transistor TR1 being set as an inverting output Qn. The transistor TR2 has a gate as an inverting input INn, and has a drain thereof connected to the drain of the transistor TR4, the drain of the transistor TR2 being set as a non-inverting output Qp.

The sources of the transistor TR1 and the transistor TR2 are connected to each other, and are further connected to the drain of the transistor TR5. The gate of the transistor TR5 is supplied with a clock (one of the non-inverted clock CKp and the inverted clock CKn). The source of the transistor TR5 is connected to the reference potential (for example the ground potential GND).

The respective sources of the transistor TR3 and the transistor TR4 are connected to the power supply Vdd, and the respective gates of the transistor TR3 and the transistor TR4 in respective stages are connected to the common bias circuit 228.

The data retaining circuit 226 has a structure formed by cross connection of two NMOSs (N-type MOS transistors), the respective drains of the transistors being connected to the non-inverting output Qp and the inverting output Qn of the data take-in circuit 224. Specifically, a cross connection structure is adopted in which the drain of the transistor TR6 connected to the inverting output Qn of the data take-in circuit 224 is connected to the gate of the transistor TR7, and the drain of the transistor TR7 connected to the non-inverting output Qp of the data take-in circuit 224 is connected to the gate of the transistor TR6.

The sources of the transistor TR6 and the transistor TR7 are connected to each other, and are further connected to the drain of a transistor TR8. The gate of the transistor TR8 is supplied with a clock (that is one of the non-inverted clock CKp and the inverted clock CKn and which is different from the input to the transistor TR5). The source of the transistor TR8 is connected to the reference potential (for example the ground potential GND).

Incidentally, the respective sources of the transistor TR5 and the transistor TR8 may be commonly connected to the reference potential via a transistor forming a current source. The current source in this case is configured to supply a fixed bias current.

The bias circuit 228 connected to the respective gates of the transistor TR3 and the transistor TR4 of the data take-in circuit 224 has a PMOS transistor TR9 that is current-mirror-connected to the transistor TR3 and the transistor TR4. The transistor TR9 has a source connected to the power supply Vdd, and has a drain and a gate connected to the gates of the transistor TR3 and the transistor TR4 and connected to the reference potential (for example the ground potential GND) via a current source Is2 of a variable current value type.

The current source Is2 is controlled by the frequency division control current Idiv as the frequency division control signal CN_DIV from the frequency divider control section 257. Alternatively, the current source Is2 may be incorporated into the voltage-to-current converting section 256 or the buffer section 270. In this case, the output current of the current source Is2 is the frequency division control current Idiv itself as the frequency division control signal CN_DIV. In either case, the bias current supplied to each transistor TR of the D latch 222 via the transistor TR3 and the transistor TR4 as the active load is substantially proportional to the frequency division control current Idiv.

Incidentally, in a case where the control input terminal of the frequency dividing section 220 is of a voltage receiving type, it suffices to control the gates of the transistor TR3 and the transistor TR4 by a voltage signal.

The operation of the frequency dividing section 220 will be described with reference to FIG. 4C. Suppose in the following that the non-inverted clock CKp is supplied to the transistor TR5 in the first stage, and that the inverted clock CKn is supplied to the transistor TR5 in the second stage. First, suppose that the inverting output Qn2 in the second stage is at an H-level, and that the non-inverting output Qp2 in the second stage is at an L-level (period of T0). In the first stage, the data take-in circuit 224 takes in data in the second stage in a period T1 in which the non-inverted clock CKp is an H-level, and retains the taken-in data in a period T2 in which the inverted clock CKn is an H-level. As a result, in the first stage, the inverting output Qn1 is at an L-level, and the non-inverting output Qp1 is at an H-level.

Thereafter, in the second stage, the data take-in circuit 224 takes in the data retained in the first stage in the period T2 in which the inverted clock CKn is an H-level, and retains the taken-in data in a period T3 in which the non-inverted clock CKp is an H-level. As a result, in the second stage, the inverting output Qn2 is at an L-level, and the non-inverting output Qp2 is at an H-level. Thereby, the frequency-divided oscillating signal Vout1 resulting from frequency-dividing the oscillation frequency Fcco of the output oscillating signal Vout input as the non-inverted clock CKp and the inverted clock CKn into ½ is output from the second stage.

FIG. 4D shows an example of the characteristic of the maximum operating frequency Fdiv_max with respect to the frequency division control current Idiv of the frequency dividing section 220. In this example, the maximum operating frequency Fdiv_max monotonically increases with the frequency division control current Idiv, and in particular, the maximum operating frequency Fdiv_max increases substantially in proportion to the frequency division control current Idiv. Though not shown in the figure, a current Ipw consumed by the frequency dividing section 220 may be considered to be substantially proportional to the bias current of the frequency dividing section 220, and the consumed current Ipw also increases substantially in proportional to the frequency division control current Idiv.

Figure 5A:
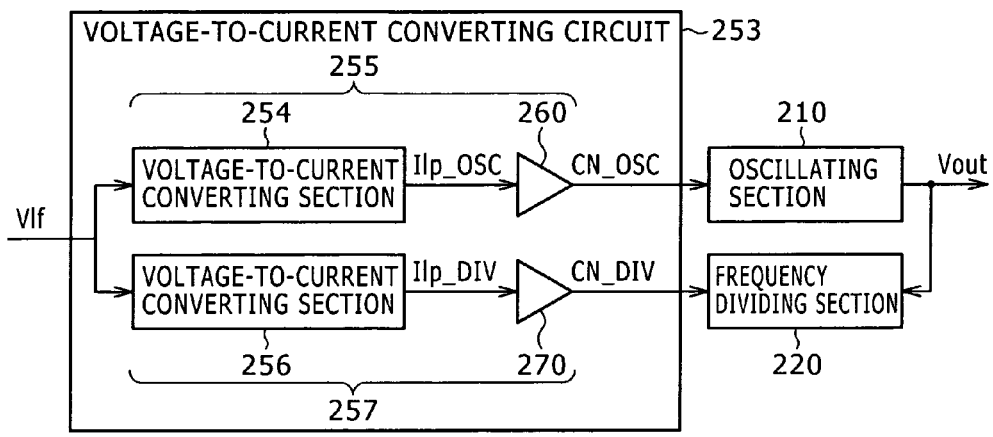
FIGS. 5A, 5B, and 5C are diagrams showing a control system of a voltage-to-current converting circuit.

Relation Between Control Responses of Oscillating Section and Frequency Dividing Section FIGS. 5A to 6E are diagrams of assistance in explaining relation between the control response of the oscillating section 210 according to the oscillation control signal CN_OSC and the control response of the frequency dividing section 220 according to the frequency division control signal CN_DIV. FIGS. 5A to 5C show control systems of a voltage-to-current converting circuit 253 according to the present embodiment. FIGS. 6A to 6E are diagrams of assistance in explaining an example of the control responses of the oscillating section 210 and the frequency dividing section 220 in the cases of the present embodiment and a comparative example in which the present embodiment is not adopted.

Figure 5B:
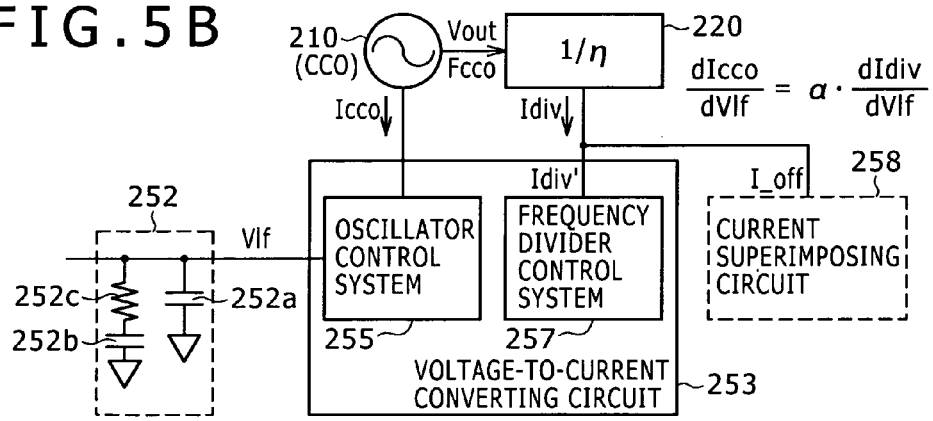
Figure 5C:
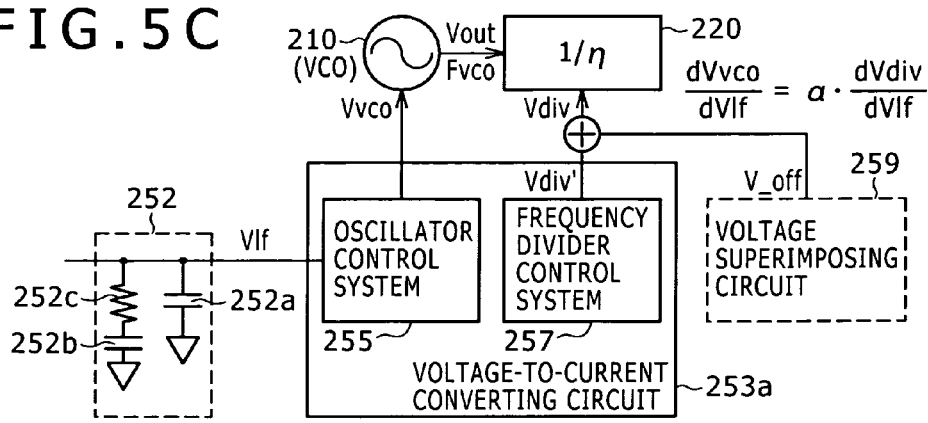

FIG. 5A is a functional block diagram in which attention is directed to the system of the voltage-to-current converting section 254, the buffer section 260, and the oscillating section 210 and the system of the voltage-to-current converting section 256, the buffer section 270, and the frequency dividing section 220. FIG. 5B is a functional block diagram particularly representing a case where the oscillating section 210 in FIG. 5A is a current controlled oscillating circuit and the control input terminal of the frequency dividing section 220 in FIG. 5A is of a current receiving type. FIG. 5C is a functional block diagram particularly representing a case where the oscillating section 210 in FIG. 5A is a voltage controlled oscillating circuit and the control input terminal of the frequency dividing section 220 in FIG. 5A is of a voltage receiving type. FIG. 5B and FIG. 5C show an example in which the filter circuit 252 of the loop filter section 250 is formed by connecting a single circuit of a capacitor 252a and a series circuit of a capacitor 252b and a resistive element 252c in parallel with each other.

FIGS. 6A to 6C are characteristic diagrams showing an example of relation between the control responses of the two systems of the oscillator control section 255 and the frequency divider control section 257 according to the present embodiment. FIG. 6D is a characteristic diagram showing an example of relation of control response in the comparative example in which the present embodiment is not adopted. FIG. 6E is a characteristic diagram showing an example of relation of control response of the current consumed by the frequency dividing section 220 according to the present embodiment.

In the reference timing generating section 110 according to the present embodiment, the bias current of the frequency dividing section 220 is controlled by the frequency division control signal CN_DIV from the buffer section 270. When the control input terminal of the frequency dividing section 220 is of a current receiving type, the frequency division control signal CN_DIV is a frequency division control current Idiv so as to correspond to the case where the oscillating section 210 is a current controlled oscillating circuit. When the control input terminal of the frequency dividing section 220 is of a voltage receiving type, the frequency division control signal CN_DIV is a frequency division control voltage Vdiv so as to correspond to the case where the oscillating section 210 is a voltage controlled oscillating circuit. The following description will be made supposing that the control input terminal of the frequency dividing section 220 is of a current receiving type unless otherwise specified.

Incidentally, it is not essential that the oscillating section 210 and the frequency dividing section 220 be both of the same type, that is, a current type or a voltage type. There may be a mode in which one of the oscillating section 210 and the frequency dividing section 220 is of a current type, and the other is of a voltage type. That is, there may be a mode in which the oscillating section 210 is a current controlled oscillating circuit, and the control input terminal of the frequency dividing section 220 is of a voltage receiving type, or there may be a mode in which the oscillating section 210 is a voltage controlled oscillating circuit, and the control input terminal of the frequency dividing section 220 is of a current receiving type.

The frequency dividing section 220 may have either of a configuration in which the bias current of the frequency dividing section 220 is controlled by only a control current and a configuration in which the bias current of the frequency dividing section 220 is controlled by a current obtained by adding a constant current (that is, an offset component) to the control current. In addition, the frequency dividing section 220 may be formed by only a frequency divider controlled by a bias current, or may be formed by a combination of a frequency divider controlled by a bias current and a frequency divider of another system.

In the present embodiment, each circuit is configured such that the control response of the oscillator control section 255 of the voltage-to-current converting section 254 and the buffer section 260 and the control response of the frequency divider control section 257 of the voltage-to-current converting section 256 and the buffer section 270 on the basis of the loop filter voltage Vlf have predetermined correlation to each other.

A typical method for making "the control responses have predetermined correlation to each other" can be achieved by making "the respective values of the oscillation control signal CN_OSC and the frequency division control signal CN_DIV on the basis of the loop filter voltage Vlf change in substantially the same manner." For example, as in the first example shown in FIG. 6A, the method can be achieved by making the respective values of the oscillation control signal CN_OSC and the frequency division control signal CN_DIV on the basis of the loop filter voltage Vlf have substantially proportional relation to each other. That is, the two systems of the oscillator control section 255 and the frequency divider control section 257 are configured such that the frequency division control signal CN_DIV for controlling the frequency dividing section 220 is proportional to the oscillation control signal CN_OSC for controlling the oscillating section 210. In other words, the values of the frequency division control signal CN_DIV and the oscillation control signal CN_OSC are made expressible by a linear function equation (linear equation) of the loop filter voltage Vlf.

As far as this is concerned, it is not essential that the relation of the oscillation frequency Fosc to the oscillation control signal CN_OSC be expressed by a linear function equation or that the relation of the current Ipw consumed by the frequency dividing section 220 and the maximum operating frequency Fdiv_max to the frequency division control signal CN_DIV be expressed by a linear function equation. This relation is true not only for a case where the oscillation control signal CN_OSC and the frequency division control signal CN_DIV are both a current signal but also for a case where the oscillation control signal CN_OSC and the frequency division control signal CN_DIV are both a voltage signal and a case where one of the oscillation control signal CN_OSC and the frequency division control signal CN_DIV is a current signal and the other is a voltage signal.

Incidentally, in a case where a current superimposing circuit 258 shown in FIG. 5B is provided, and a steady-state current I_off is superimposed on a control signal based on the loop filter voltage Vlf (frequency division control current Idiv'), it suffices for the control signal excluding the steady-state current I_off to have substantially proportional relation, as in the second example shown in FIG. 6B. Though not shown in the figures, also in a case where a steady-state current is superimposed on a control signal based on the loop filter voltage Vlf (oscillation control current Iosc'), it suffices for the control signal excluding the steady-state current to have substantially proportional relation.

That is, a component obtained by synthesizing (adding) the frequency division control current Idiv' obtained by the voltage-to-current converting section 256 and the steady-state current I_off as an offset current component generated by a current source (not shown) possessed by the current superimposing circuit 258 is supplied as frequency division control current Idiv to the frequency dividing section 220.

In this case, there is an advantage in that the steady-state current I_off as a fixed bias current component can be supplied to the frequency dividing section 220 and thus an operating point within the frequency dividing section 220 can be stabilized even when the oscillation control current Icco supplied to the oscillating section 210 formed by a current controlled oscillating circuit is substantially zero (Icco≈0 μA). That is, because of the presence of the auxiliary current source (current superimposing circuit 258), an operating margin can be expanded by an auxiliary current (steady-state current I_off).

It is also possible to prevent a frequency division failure (principally in a region of Icco≈0 μA) in a case where an error between the oscillation control current Icco and the frequency division control current Idiv which error results from element variations causes a situation in which Icco>0 μA and Idiv'=0 μA.

The above description relating to the offset component applies not only to the offset current component but also to an offset voltage component. For example, in a case where a voltage superimposing circuit 259 shown in FIG. 5C is provided, and a steady-state voltage V_off is superimposed on a control signal based on the loop filter voltage Vlf (frequency division control voltage Vdiv'), it suffices for each control signal excluding the steady-state voltage V_off to have substantially proportional relation. Though not shown in the figures, also in a case where a steady-state voltage is superimposed on a control signal based on the loop filter voltage Vlf (oscillation control current Vosc'), it suffices for the control signal excluding the steady-state voltage to have substantially proportional relation.

That is, a component obtained by synthesizing (adding) the frequency division control voltage Vdiv' and the steady-state voltage V_off as an offset voltage component generated by a voltage source (not shown) possessed by the voltage superimposing circuit 259 is supplied as frequency division control voltage Vdiv to the frequency dividing section 220.

In this case, there is an advantage in that the steady-state voltage V_off as a fixed bias voltage component can be supplied to the frequency dividing section 220 and thus an operating point within the frequency dividing section 220 can be stabilized even when the oscillation control voltage Vvco supplied to the oscillating section 210 formed by a voltage controlled oscillating circuit is substantially zero (Vvco≈0 V). That is, it suffices to consider in the same manner as in the case of the offset current component, and because of the presence of the auxiliary voltage source (voltage superimposing circuit 259), an operating margin can be expanded by an auxiliary voltage (steady-state voltage V_off). It is also possible to prevent a frequency division failure (principally in a region of Vvco≈0 V) in a case where an error between the oscillation control voltage Vvco and the frequency division control voltage Vdiv which error results from element variations causes a situation in which Vvco>0 V and Vdiv'=0 V.

Letting α be a constant of proportionality, the above can be expressed by a proportional equation $dCN\_OSC/dVlf = \alpha \cdot dCN\_DIV/dVlf$. It suffices for the constant α of proportionality to be independent of the loop filter voltage Vlf, and the value of the constant α of proportionality is desirably made variable as appropriate (an example of circuit configuration therefor will be described later). A perfect proportional relation (perfect linear function equation) is desirably obtained in a case where the constant α of proportionality is a constant value without depending on the loop filter voltage Vlf. However, there may be a relation α(Vlf), that is, the constant α of proportionality may be somewhat dependent on the loop filter voltage Vlf.

For example, as in the third example shown in FIG. 6C, whereas the value of one of the oscillation control signal CN_OSC and the frequency division control signal CN_DIV is expressed by a linear function equation of the loop filter voltage Vlf, the value of the other may deviate from a linear function equation though exhibiting a monotonically increasing characteristic with respect to the loop filter voltage Vlf. In addition, the values of both of the oscillation control signal CN_OSC and the frequency division control signal CN_DIV may deviate from a linear function equation though exhibiting a monotonically increasing characteristic with respect to the loop filter voltage Vlf. This means that in terms of circuit configuration, no problem is presented regardless of whether linear relation can be set ideally (theoretically) or whether nonlinear relation is obtained in practice.

When the oscillating section 210 is a current controlled oscillating circuit, and the control input terminal of the frequency dividing section 220 is of a current receiving type, the above equation can be converted into $dIcco/dVlf = \alpha \cdot dIdiv/dVlf$. When the oscillating section 210 is a voltage controlled oscillating circuit, and the control input terminal of the frequency dividing section 220 is of a voltage receiving type, the above equation can be converted into $dVcco/dVlf = \alpha \cdot dVdiv/$ dVlf. When the oscillating section 210 is a current controlled oscillating circuit, and the control input terminal of the frequency dividing section 220 is of a voltage receiving type, the above equation can be converted into $dIcco/dVlf = \alpha \cdot dVdiv/dVlf$. When the oscillating section 210 is a voltage controlled oscillating circuit, and the control input terminal of the frequency dividing section 220 is of a current receiving type, the above equation can be converted into $dVcco/dVlf = \alpha \cdot dIdiv/dVlf$.

A typical mode for making "the control responses have predetermined correlation to each other" is not limited to a mode in which the relation between the values of the oscillation control signal CN_OSC and the frequency division control signal CN_DIV on the basis of the loop filter voltage Vlf is expressed by a proportional equation as described above. The relation between the values of the oscillation control signal CN_OSC and the frequency division control signal CN_DIV on the basis of the loop filter voltage Vlf may be expressed by a function equation of higher order such as second order or higher, for example. In this case, however, a circuit configuration for actively setting such a high-order function equation is more complex than in the case of a proportional equation. Thus, making the values of both of the oscillation control signal CN_OSC and the frequency division control signal CN_DIV expressible by the above-described "proportional relation," that is, a linear function equation of the loop filter voltage Vlf can be said to be most suitable.

In addition, an overall conversion ratio (Gm_OSC× K_OSC) in the system of the voltage-to-current converting section 254 and the buffer section 260 and an overall conversion ratio (Gm_DIV×K_DIV) in the system of the voltage-to-current converting section 256 and the buffer section 270 are adjusted so that the maximum operating frequency Fdiv_max of the frequency dividing section 220 is higher than the oscillation frequency of the oscillating section 210.

This is based on a fact that a phase-locked loop circuit using a frequency divider whose maximum operating frequency Fdiv_max can be determined by a bias current is desired to satisfy a condition that the maximum operating frequency of the frequency divider exceed an arbitrary oscillation frequency Fosc of the oscillator. That is, the frequency dividing section 220 needs to operate at the arbitrary oscillation frequency Fosc of the oscillating section 210, and letting Fdiv_max be the maximum operating frequency of the frequency dividing section 220, Fosc_max be the maximum oscillation frequency of the oscillating section 210, and Fosc be the arbitrary oscillation frequency of the oscillating section 210, "Fdiv_max>Fosc_max>Fosc" needs to be satisfied.

On the other hand, after the phase-locked loop circuit is locked, it suffices for the frequency dividing section 220 to operate at a desired lock frequency Flock, and when conditions are limited to conditions after the phase-locked loop circuit is locked, it suffices to satisfy "Fdiv_max>Flock." It can be said to be useless to continue sending a bias current giving the maximum operating frequency Fdiv_max to the frequency dividing section 220 even after the locking.

For example, a high-frequency phase-locked loop circuit is used for high-speed communication between chips used within a camera, a television set or the like. In a high-frequency phase-locked loop circuit, the oscillation frequency of an oscillator is high, and thus a frequency divider operating at a correspondingly high frequency is necessary.

The frequency divider is generally formed by a static flip-flop, which may not be able to be operated at a high frequency in some cases.

In consideration of such cases, a frequency divider of a type through which a bias current is sent steadily, such as a CML (current mode logic) type or the like that facilitates impedance matching is used as the frequency dividing section 220 in the present embodiment.

CML is collector output. Generally, the bias current of the frequency divider is fixed at a certain value, and the value is set at a bias current value at a certain level or higher so as to satisfy the above-described condition. The voltage amplitude of an output signal is a product of the bias current value and a load resistance on a collector side, and interfacing is very easy.

The maximum operating frequency of a frequency divider of such a type can be determined by a bias current, and the maximum operating frequency monotonically increases with the bias current. That is, the maximum operating frequency is determined by the bias current. However, while it suffices to decrease the bias current to decrease the current Ipw consumed by such a frequency divider, the above-described condition imposes a limitation that prevents the bias current from being decreased below a certain value.

Thus, as shown in FIG. 6D, the maximum operating frequency Fdiv_max of the frequency divider is set at a value sufficiently higher than the lock frequency Flock of the phase-locked loop circuit. After the phase-locked loop circuit is locked, the frequency divider is supplied with a bias current higher than is necessary for operation at the lock frequency Flock of the phase-locked loop circuit, and thus an unnecessary current is sent through the frequency divider after the locking. The unnecessary current after the locking cannot be reduced as long as the frequency divider is operated by a fixed bias current satisfying "Fdiv_max>Fosc_max>Fosc."

As a method for solving this problem, the present embodiment adopts a method of operating the oscillating section 210 and the frequency dividing section 220 in a state of being interlocked with each other by control signals based on the loop filter voltage Vlf from the loop filter section 250.

Specifically, first, the bias current of the frequency dividing section 220 is dynamically changed on the basis of the loop filter voltage Vlf (a loop filter output current Ilp_DIV or a loop filter output voltage Vlp_DIV based on the loop filter voltage Vlf).

In this case, the phase-locked loop circuit according to the present embodiment changes the maximum operating frequency Fdiv_max of the frequency dividing section 220 by controlling the bias current flowing through the frequency dividing section 220 by the frequency division control signal CN_DIV based on the loop filter voltage Vlf as the oscillation frequency Fosc of the oscillating section 210 changes on the basis of the oscillation control signal CN_OSC.

As shown in FIG. 6E, the frequency dividing section 220 is also controlled by the frequency division control signal CN_DIV based on the loop filter voltage Vlf so as to be interlocked with the operation of the oscillating section 210 according to the oscillation control signal CN_OSC based on the loop filter voltage Vlf, whereby the oscillation frequency Fosc of the oscillating section 210 and the bias current (that is, power consumption) of the frequency dividing section 220 are changed.

The relation between the control signals (the oscillation control signal CN_OSC and the frequency division control signal CN_DIV) is set such that the maximum operating frequency Fdiv_max of the frequency dividing section 220 which frequency corresponds to an arbitrary loop filter voltage Vlf both in a pull-in process and at a time of locking is higher than the oscillation frequency Fosc of the oscillating section 210 when the oscillating section 210 and the frequency dividing section 220 are controlled by the respective control signals (the oscillation control signal CN_OSC and the frequency division control signal CN_DIV) based on the same loop filter voltage Vlf.

The frequency division control signal CN_DIV giving the maximum operating frequency Fdiv_max of the frequency dividing section 220 which frequency corresponds to a loop filter voltage Vlfmax giving a maximum oscillation frequency Fosc_max of the oscillating section 210 is set as a frequency division control signal CN_DIV_max. The frequency division control signal CN_DIV corresponding to a loop filter voltage Vlflock at the time of locking of the phase-locked loop circuit is set as a frequency division control signal CN_DIV_lock.

When such a method is adopted, the oscillating section 210 and the frequency dividing section 220 operate so as to be interlocked with each other by the control signals based on the loop filter voltage Vlf from the loop filter section 250 both in a pull-in process and at a time of locking.

After the phase-locked loop circuit is locked at a fixed lock frequency Flock, the frequency dividing section 220 is controlled by the frequency division control signal CN_DIV_lock corresponding to the loop filter voltage Vlf at the time of locking. Because "Frequency Division Control Signal CN_DIV_max>Frequency Division Control Signal CN_DIV_lock," the bias current flowing through the frequency dividing section 220 can be decreased to a certain amount, and thus the consumed current can be reduced (power consumption can be reduced), while the condition that the maximum operating frequency Fdiv_max of the frequency dividing section 220 be made higher than the lock frequency Flock is satisfied. The current Ipw consumed by the frequency dividing section 220 at the time of locking is Ipwlock corresponding to the frequency division control signal CN_DIV_lock, so that power consumption can be reduced as compared with cases where the present embodiment is not applied.

For example, in a pull-in process in the phase-locked loop circuit, the oscillation frequency Fosc of the oscillating section 210 changes dynamically, and there is a state in which the oscillation frequency Fosc of the oscillating section 210 is higher than the lock frequency Flock.

In this case, the phase-locked loop circuit according to the present embodiment changes the maximum operating frequency Fdiv_max of the frequency dividing section 220 by controlling the bias current flowing through the frequency dividing section 220 by the control signal (frequency division control signal CN_DIV) based on the loop filter voltage Vlf as the oscillation frequency Fosc of the oscillating section 210 changes.

Because the relation between the control signals is set such that the maximum operating frequency Fdiv_max of the frequency dividing section 220 which frequency corresponds to the loop filter voltage Vlf is higher than the oscillation frequency Fosc of the oscillating section 210, the oscillating section 210 and the frequency dividing section 220 operate so as to be interlocked with each other by the control signals based on the loop filter voltage Vlf without any inconvenience both in a pull-in process and at a time of locking. Thus, after the phase-locked loop circuit is locked at a fixed lock frequency Flock, the bias current flowing through the frequency dividing section 220 can be decreased to a certain amount, and thus the consumed current can be reduced (power consumption can be reduced), while the condition that the maximum operating frequency Fdiv_max of the frequency dividing section 220 be made higher than the lock frequency Flock is satisfied.

The frequency dividing section 220 operates without any problem when a method is adopted such that the oscillation frequency Fosc of the oscillating section 210 and the maximum operating frequency Fdiv_max of the frequency dividing section 220 are interlocked with the loop filter voltage Vlf, and "Fdiv_max>Fosc" is always satisfied at an arbitrary loop filter voltage Vlf.

When a configuration is adopted such that the current Ipw consumed by the frequency dividing section 220 increases as the frequency division control signal CN_DIV becomes larger, the current Ipw consumed by the frequency dividing section 220 can be reduced after the phase-locked loop circuit is locked at a desired frequency.

Concrete description will be made in the following by taking, as an example, a case where the oscillating section 210 and the frequency dividing section 220 are both of a current type, that is, the oscillating section 210 is a current controlled oscillating circuit and the control input terminal of the frequency dividing section 220 is of a current receiving type.

Voltage-to-Current Converting Section

First Example

FIGS. 7A-1 to 7D and FIG. 8 are diagrams of assistance in explaining a first example of the voltage-to-current converting section 254 and the voltage-to-current converting section 256 (which sections will be referred to collectively as a voltage-to-current converting circuit 253).

A voltage-to-current converting circuit 253A in the first example can be said to be a basic configuration of the voltage-to-current converting circuit 253. The relation between the voltage-to-current converting section 254 and the voltage-to-current converting section 256 is set such that the frequency division control current Idiv of the frequency dividing section 220 is proportional to the oscillation control current Icco of the oscillating section 210 so as to satisfy $dIcco/dVlf=\alpha \cdot dIdiv/dVlf$, that is, such that "$Icco=\alpha \cdot Idiv$" is satisfied.

It can be said to be easiest to adopt a mechanism of a so-called current copy, for example, to satisfy such a relation. Either of an N-type transistor and a P-type transistor can be used as a transistor for providing the mechanism of the current copy. Various circuit configurations are conceivable. However, any of the circuit configurations may be considered to function as a current source section for generating a current on the basis of the loop filter voltage Vlf.

Figures 1, 7A:
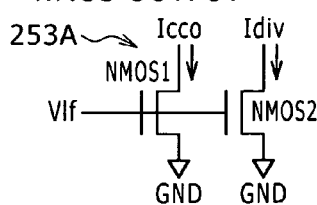
Figures 2, 7A:
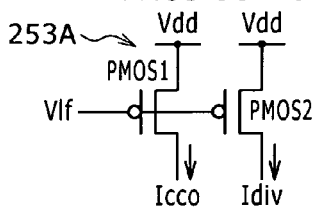

For example, an example shown in FIG. 7A-1 has NMOS output stages. In this example, one NMOS1 (first N-type MOS transistor) is used as the voltage-to-current converting section 254, and one NMOS2 (second N-type MOS transistor) is used as the voltage-to-current converting section 256. The NMOS1 will be referred to as a main output stage for the oscillation control current Icco, and the NMOS2 will be referred to as a replica output stage for the frequency division control current Idiv. The NMOS1 and the NMOS2 have gates connected to the common loop filter voltage Vlf, have sources connected to a reference potential (for example grounded), and have drains as output terminals of the respective control currents.

An example shown in FIG. 7A-2 has PMOS output stages. In this example, one PMOS1 (first P-type MOS transistor) is used as the voltage-to-current converting section 254, and one PMOS2 (second P-type MOS transistor) is used as the voltage-to-current converting section 256. The PMOS1 will be referred to as a main output stage for the oscillation control current Icco, and the PMOS2 will be referred to as a replica output stage for the frequency division control current Idiv. The PMOS1 and the PMOS2 have gates connected to the common loop filter voltage Vlf, have sources connected to a power supply, and have drains as output terminals of the respective control currents.

From a different viewpoint, each of the configurations can be said to have an identical body (current mirror configuration) for the voltage-to-current converting section 254 and the voltage-to-current converting section 256 and have a plurality of output stages corresponding to the control currents, respectively.

Figures 1, 7B:
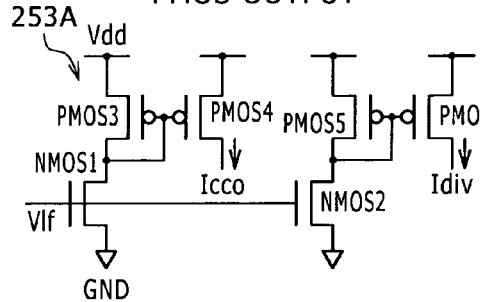
Figures 2, 7B:
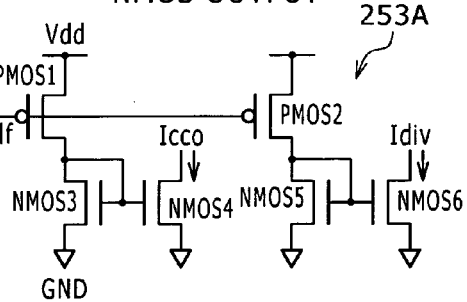

Incidentally, the drains of the NMOS1 and the PMOS1 and the drains of the NMOS2 and the PMOS2 may be provided with a transistor pair of a current mirror configuration as shown in FIG. 7B-1 and FIG. 7B-2 to make provision for the folding of a current direction. By doing so, the NMOS output stages in FIG. 7A-1 can be changed to PMOS output stages, and the PMOS output stages in FIG. 7A-2 can be changed to NMOS output stages.

In the case of the voltage-to-current converting circuit 253A in the first example, voltage-to-current conversion is performed by using the Vgs-Ids characteristics of the NMOSs or the PMOSs. Such a configuration can operate even with a low voltage for logic of an advanced process, and has a simple structure, thus providing an advantage of being able to be mounted in a small area.

In the voltage-to-current converting circuit 253A in the first example, a current mirror ratio between the NMOS1 and the NMOS2 (Current of NMOS2/Current of NMOS1) or a current mirror ratio between the PMOS1 and the PMOS2 (Current of PMOS2/Current of PMOS1) is made to correspond to the constant α of proportionality. The current mirror ratio can be set by the numbers of fingers of transistors (finger ratio), the numbers of transistors (multi-ratio), or the sizes of transistors (size ratio).

Figure 7C:
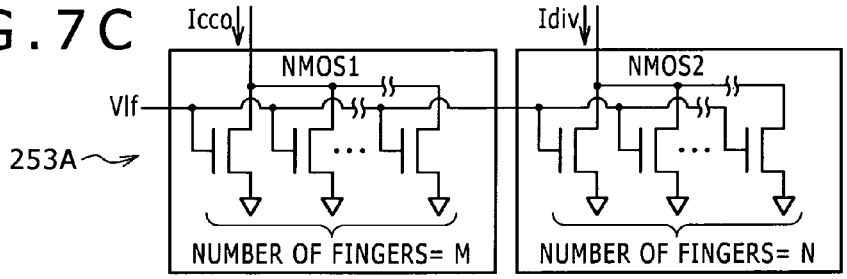

For example, FIG. 7C is a diagram showing an example of detailed configuration of FIG. 7A-1. The NMOS1 is formed by an aggregate of M (M is the number of fingers of the NMOS1) NMOS single elements, and the NMOS2 is formed by an aggregate of N (N is the number of fingers of the NMOS2) NMOS single elements. The current mirror ratio is N/M, and Idiv=(N/M)·Icco. It therefore suffices to set the constant α of proportionality=Icco/Idiv=M/N.

Figure 8:
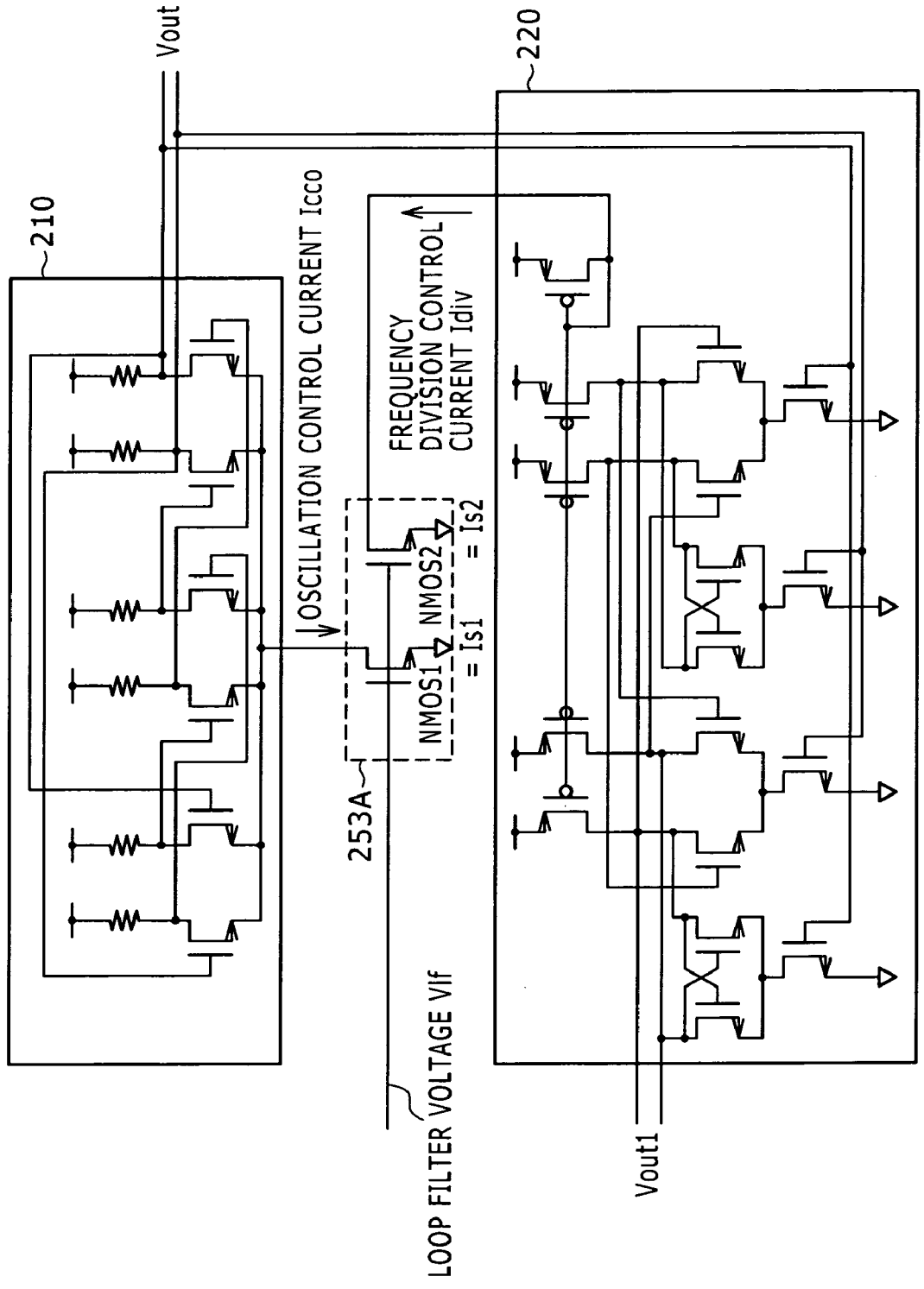
FIG. 8 is a diagram (2) of assistance in explaining the first example of the voltage-to-current converting circuit.

In relation to the current controlled oscillating circuit (oscillating section 210) shown in FIG. 3A and the frequency dividing section 220 shown in FIG. 4B, the NMOS1 and the NMOS2 shown in FIG. 7A-1 can be used as the current source Is1 and the current source Is2, respectively, as shown in FIG. 8, for example. In addition, though not shown in the figures, the NMOS1 and the NMOS2 of the configuration shown in FIG. 7B-2 with folding provisions made by transistor pairs can be used as the current source Is1 and the current source Is2, respectively.

Figure 7D:
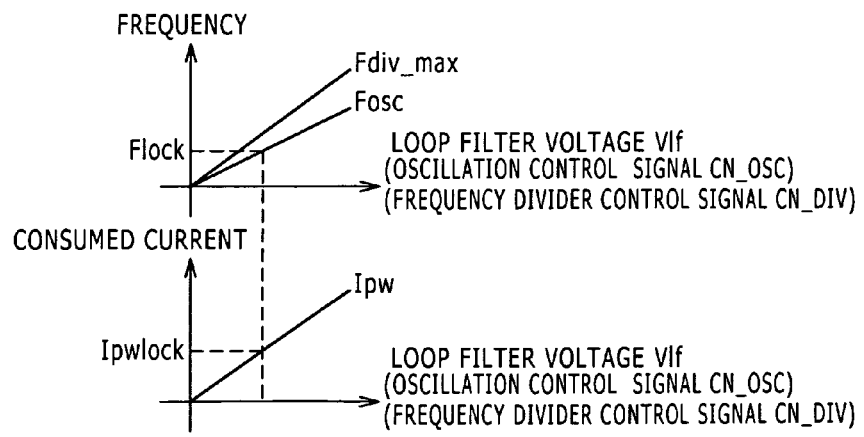

The constant α of proportionality needs to be adjusted so that the maximum operating frequency Fdiv_max of the frequency dividing section 220 is higher than the oscillation frequency Fcco of the current controlled oscillator of the oscillating section 210. At this time, the relation of the maximum operating frequency Fdiv_max of the frequency dividing section 220 and the oscillation frequency Fcco of the current controlled oscillator to the oscillation control current Icco of the current controlled oscillator and the frequency division control current Idiv is as shown in FIG. 7D.

In this example, the oscillation frequency Fcco of the current controlled oscillator of the oscillating section 210 and the maximum operating frequency Fdiv_max of the frequency dividing section 220 increase substantially in proportion to the oscillation control current Icco (=α·Idiv), that is, the loop filter voltage Vlf serving as a basis for the oscillation control current Icco. In addition, the condition for the operation of the frequency dividing section 220 that "Fdiv_max>Fcco" is satisfied, and the current Ipw consumed by the frequency dividing section 220 increases substantially in proportional to the frequency division control current Idiv (that is, the oscillation control current Icco and the loop filter voltage Vlf).

In this case, in a pull-in process in the phase-locked loop circuit, the oscillation frequency Fcco of the current controlled oscillator changes dynamically, and there is a state of the oscillation frequency being higher than the lock frequency Flock.

The phase-locked loop circuit according to the present embodiment changes the maximum operating frequency Fdiv_max of the frequency dividing section 220 by controlling the bias current flowing through the frequency dividing section 220 as the oscillation frequency Fcco of the current controlled oscillator changes. By adjusting the constant α of proportionality as described above so as to satisfy "Icco=α·Idiv," the maximum operating frequency Fdiv_max of the frequency dividing section 220 is adjusted to be higher than the oscillation frequency Fcco of the current controlled oscillator at an arbitrary loop filter voltage Vlf.

After the phase-locked loop circuit is locked at a desired fixed lock frequency Flock, the bias current flowing through the frequency dividing section 220 can be set to a certain amount corresponding to the loop filter voltage Vlf at the time of locking, and thus the current consumed by the frequency dividing section 220 can be reduced, while the condition that the maximum operating frequency Fdiv_max of the frequency dividing section 220 be made higher than the lock frequency Flock is satisfied.

When the oscillating section 210 and the frequency dividing section 220 are controlled by a voltage signal, an operational amplifier circuit or the like may be necessary. In that case, a certain level of power supply voltage is necessary as a power supply voltage for the voltage-to-current converting circuit 253. On the other hand, when the oscillating section 210 and the frequency dividing section 220 are controlled by a current signal as in the first example, limitations on the power supply voltage are hardly imposed, as is clear from the figures. The first example is therefore suitable for application in a low-voltage process.

Voltage-to-Current Converting Section

Second Example

Figure 9A:
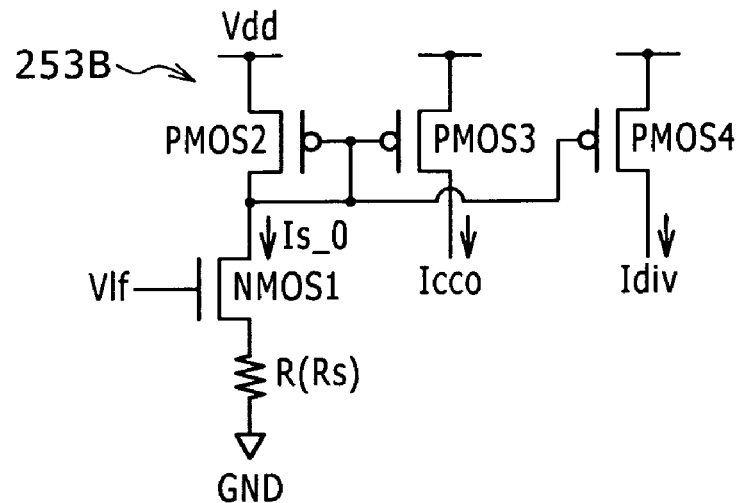
FIGS. 9A and 9B are diagrams of assistance in explaining a second example of the voltage-to-current converting circuit.
Figure 9B:
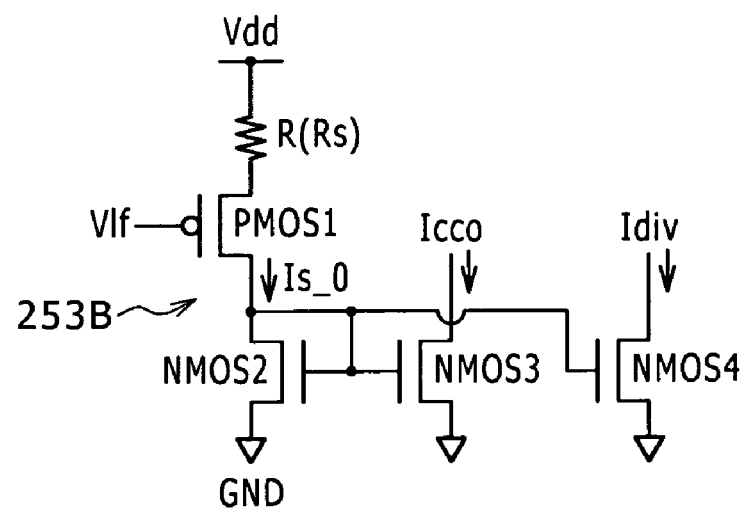

FIGS. 9A and 9B are diagrams of assistance in explaining a second example of the voltage-to-current converting circuit 253 (the voltage-to-current converting section 254 and the voltage-to-current converting section 256). FIG. 9A is an example of modification of FIG. 7A-1 or FIG. 7B-1. FIG. 9B is an example of modification of FIG. 7A-2 or FIG. 7B-2.

A voltage-to-current converting circuit 253B in the second example can reduce variation in voltage-to-current conversion characteristic as compared with the first example by using source degeneration.

For example, an example shown in FIG. 9A has PMOS output stages. In this example, the source of an NMOS1 is connected to a reference potential (for example grounded) via a resistive element R. The drain of the NMOS1 is provided with a PMOS2, a PMOS3, and a PMOS4 such that the PMOS3 and the PMOS4 are current-mirror-connected to the PMOS2. Specifically, the drain of the NMOS1 is connected with the gate and the drain of the PMOS2, and is also connected with the gates of the PMOS3 and the PMOS4. For example, the PMOS3 is made to function as a main output stage for the oscillation control current Icco, and the PMOS4 is made to function as a replica output stage for the frequency division control current Idiv.

Incidentally, when the drains of the PMOS3 and the PMOS4 are provided with a transistor pair of a current mirror configuration using NMOSs to make provision for the folding of a current direction, the PMOS output stages can be changed to NMOS output stages.

An example shown in FIG. 9B has NMOS output stages. In this example, the source of a PMOS1 is connected to a power supply via a resistive element R. The drain of the PMOS1 is provided with an NMOS2, an NMOS3, and an NMOS4 such that the NMOS3 and the NMOS4 are current-mirror-connected to the NMOS2. Specifically, the drain of the PMOS1 is connected with the gate and the drain of the NMOS2, and is also connected with the gates of the NMOS3 and the NMOS4. For example, the NMOS3 is made to function as a main output stage for the oscillation control current Icco, and the NMOS4 is made to function as a replica output stage for the frequency division control current Idiv.

Incidentally, when the drains of the NMOS3 and the NMOS4 are provided with a transistor pair of a current mirror configuration using PMOSs to make provision for the folding of a current direction, the NMOS output stages can be changed to PMOS output stages.

The NMOS1 and the PMOS1 function as a current source section for generating a current Is_0 by source degeneration on the basis of the loop filter voltage Vlf.

The voltage-to-current converting circuit 253B in the second example, which is of either of the configurations of FIG. 9A and FIG. 9B, performs voltage-to-current conversion by source degeneration with the resistive element R connected to the source of the NMOS1 or the PMOS1. With such a configuration, a voltage-to-current conversion characteristic is closer to "1/Resistance Value Rs of Resistive Element R." Thus, variation in voltage-to-current conversion characteristic is reduced, and design of the phase-locked loop circuit becomes easy. However, as compared with the first example, it is difficult to realize the second example in a low-voltage process, and the number of elements is increased, so that necessary area and power are also increased.

Voltage-to-Current Converting Section

Third Example

Figure 10A:
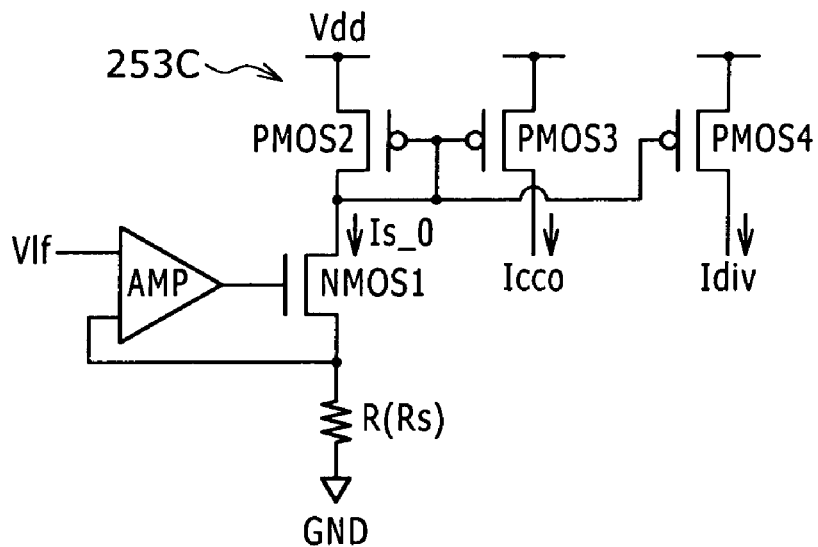
FIGS. 10A and 10B are diagrams of assistance in explaining a third example of the voltage-to-current converting circuit.
Figure 10B:
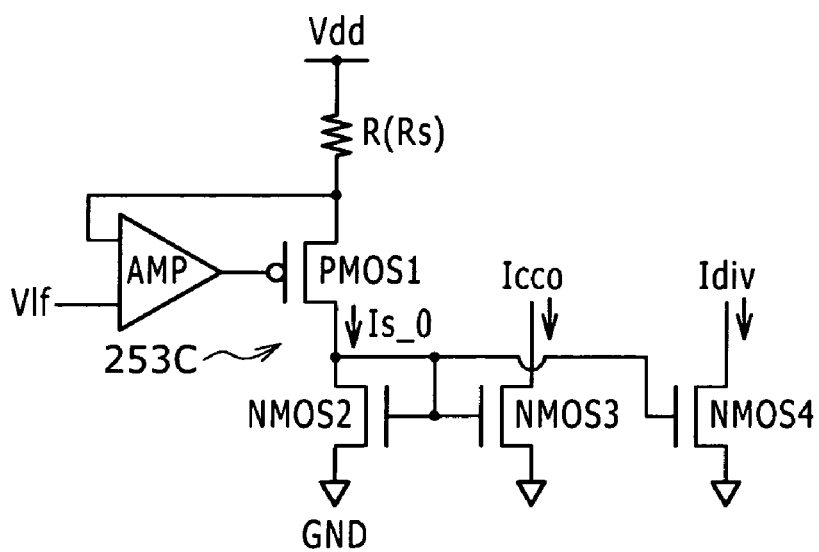

FIGS. 10A and 10B are diagrams of assistance in explaining a third example of the voltage-to-current converting circuit 253 (the voltage-to-current converting section 254 and the voltage-to-current converting section 256). FIG. 10A is an example of modification of FIG. 9A. FIG. 10B is an example of modification of FIG. 9B.

A voltage-to-current converting circuit 253C in the third example is based on the second example using source degeneration, and a feedback mechanism formed by an amplifier circuit is added to the voltage-to-current converting circuit 253C to extend the linearity of a voltage-to-current conversion characteristic and a dynamic range.

For example, in an example shown in FIG. 10A, a point of connection between an NMOS1 and a resistive element R is connected to the inverting input terminal of a voltage amplifier circuit AMP, and the output terminal of the voltage amplifier circuit AMP is connected to the gate of the NMOS1. A loop filter voltage Vlf is supplied to the non-inverting input terminal of the voltage amplifier circuit AMP. In an example shown in FIG. 10B, a point of connection between a PMOS1 and a resistive element R is connected to the inverting input terminal of a voltage amplifier circuit AMP, and the output terminal of the voltage amplifier circuit AMP is connected to the gate of the PMOS1. A loop filter voltage Vlf is supplied to the non-inverting input terminal of the voltage amplifier circuit AMP.

The voltage amplifier circuit AMP compares the loop filter voltage Vlf with a source potential (feedback voltage) expressed by a product of a current Is_0 generated by the NMOS1 or the PMOS1 and the resistance value Rs of the resistive element R, and performs feedback operation.

The voltage-to-current converting circuit 253C in the third example, which is of either of the configurations of FIG. 10A and FIG. 10B, performs feedback operation by the voltage amplifier circuit AMP so that the current Is_0 generated by the NMOS1 or the PMOS1 is "Loop Filter Voltage Vlf/Resistance Value Rs of Resistive Element R." Thus, a wide dynamic range of voltage-to-current conversion is obtained, and the linearity of a conversion coefficient is improved very much. However, as compared with the first example and the second example, it is difficult to realize the third example in a low-voltage process, and the number of elements is increased, so that necessary area and power are also increased.

Voltage-to-Current Converting Section

Fourth Example

Figures 1, 11A:
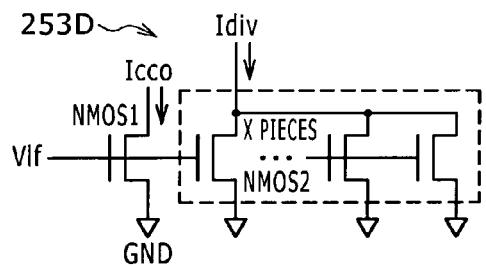
Figures 2, 11A:
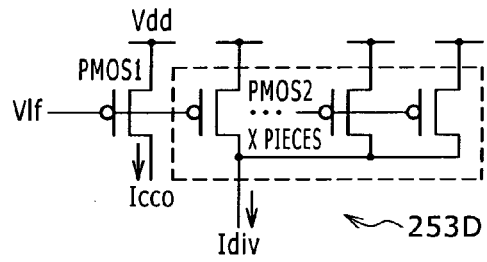
Figure 11B:
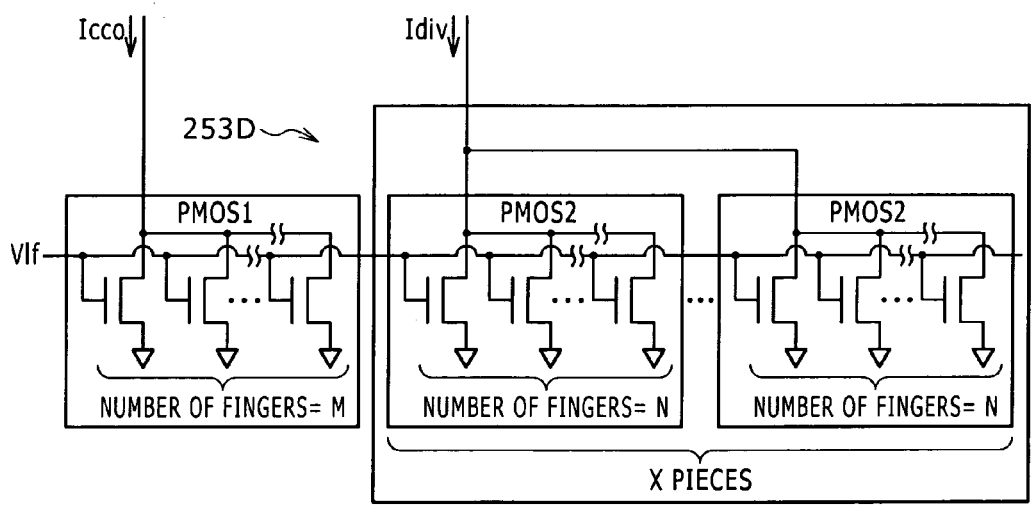

FIGS. 11A-1 to 11B are diagrams of assistance in explaining a fourth example of the voltage-to-current converting circuit 253 (the voltage-to-current converting section 254 and the voltage-to-current converting section 256). FIGS. 11A-1 and 11A-2 are functional block diagrams of the fourth example. FIG. 11B shows an example of detailed configuration.

A voltage-to-current converting circuit 253D in the fourth example is an example of modification based on the first example, the example of modification including a plurality of (X) NMOS2s (or PMOS2s: the following description will be made by taking NMOS2s) on the side of the voltage-to-current converting section 256. It suffices to set an arbitrary integer as the number X. Incidentally, while the voltage-to-current converting circuit 253D in the fourth example to be shown in the following is based on the first example, the basic configuration of the voltage-to-current converting circuit 253D in the fourth example may be the second example or the third example.

In the voltage-to-current converting circuit 253D in the fourth example, the outputs of the X NMOS2s can be added together. Idiv=(N·X/M)·Icco, and Constant α of Proportionality=M/(N·X). A minimum value of X is 1, in which case the fourth example is essentially the same as the first example. The fourth example, as with the first example, does not allow the constant α of proportionality to be changed as appropriate, but has an advantage of allowing the constant α of proportionality to be set at a desired value in a case where manufacturing is carried out after the number of NMOS2s of the same configuration is set in advance.

Voltage-to-Current Converting Section:

First Example +Fourth Example

Though not shown, fine setting of the constant α of proportionality is made possible by combining the first example with the fourth example. For example, the constant α of proportionality can be set at $M\{1/(N \cdot X)+1/n\}$ by using X NMOS2s having N fingers and using one NMOS2 having n fingers (n<N) in combination.

Voltage-to-Current Converting Section

Fifth Example

Figure 12:
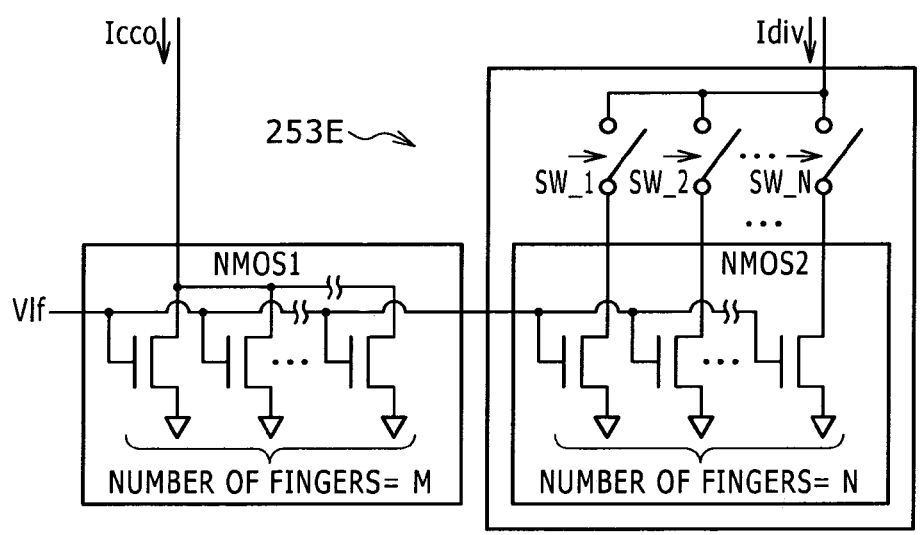
FIG. 12 is a diagram of assistance in explaining a fifth example of the voltage-to-current converting circuit.

FIG. 12 is a diagram of assistance in explaining a fifth example of the voltage-to-current converting circuit 253 (the voltage-to-current converting section 254 and the voltage-to-current converting section 256).

A voltage-to-current converting circuit 253E in the fifth example is an example of configuration that allows the constant α of proportionality to be changed as appropriate. In particular, the fifth example is based on the first example, and has switches SW_1 to SW_N for selection between the drain sides of N single elements forming an NMOS2 (or a PMOS2: the following description will be made by taking the NMOS2) on the side of the voltage-to-current converting section 256 and the control input terminal of the frequency dividing section 220. The constant α of proportionality is adjusted by adjusting the number n of switches turned on in a situation of actual use. An analog switch (for example an analog switch of a transfer gate configuration) is used as the switches SW_1 to SW_N. It suffices to set n to an arbitrary integer by a digital code, for example. Incidentally, while the voltage-to-current converting circuit 253E in the fifth example to be shown in the following is based on the first example, the basic configuration of the voltage-to-current converting circuit 253E in the fifth example may be the second example or the third example.

In the voltage-to-current converting circuit 253E in the fifth example, the outputs of the N single elements forming the NMOS2 can be added together by using the switches SW_1 to SW_N. $Idiv=(n/M) \cdot Icco$, and Constant α of Proportionality=M/n. The constant α of proportionality can be adjusted in a range of "n=1 to N." A maximum value of n is N, in which case the fifth example is essentially the same as the first example.

Though not shown, switches SW_1 to SW_M for selection may be provided between the drain sides of M single elements forming an NMOS1 (or a PMOS1: the following description will be made by taking the NMOS1) on the side of the voltage-to-current converting section 254 and the control input terminal of the current controlled oscillator of the oscillating section 210, and the constant α of proportionality may be adjusted by adjusting the number m of switches turned on in a situation of actual use. In this case, $Idiv=(N/m) \cdot Icco$, Constant α of Proportionality=m/N, and the constant α of proportionality can be adjusted in a range of "m=1 to M."

Voltage-to-Current Converting Section

Sixth Example

Figures 1, 13A:
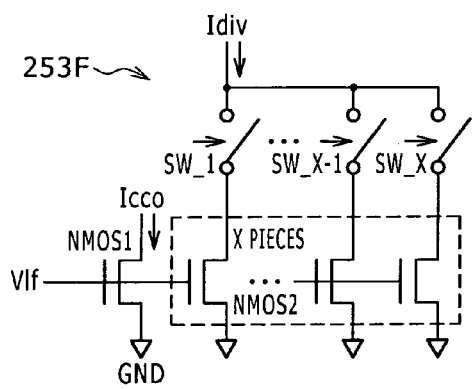
Figures 2, 13A:
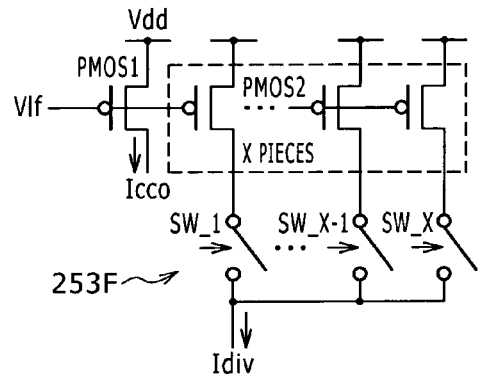
Figure 13B:
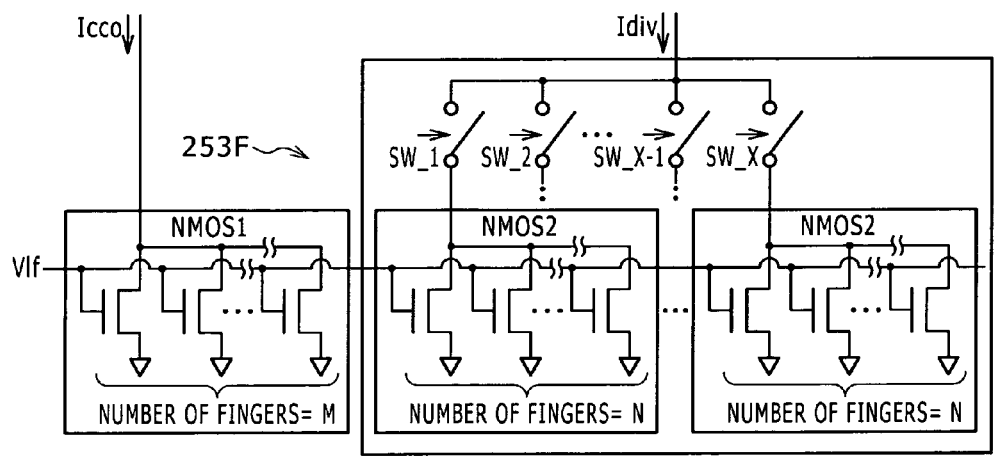

FIGS. 13-1 to 13B are diagrams of assistance in explaining a sixth example of the voltage-to-current converting circuit 253 (the voltage-to-current converting section 254 and the voltage-to-current converting section 256). FIGS. 13-1 and 13-2 are functional block diagrams of the sixth example. FIG. 13B shows an example of detailed configuration.

A voltage-to-current converting circuit 253F in the sixth example is an example of configuration that allows the constant α of proportionality to be changed as appropriate as in the fifth example. In particular, the sixth example is based on the first example, has a plurality of (X) NMOS2s (or PMOS2s: the following description will be made by taking the NMOS2s) on the side of the voltage-to-current converting section 256, and has switches SW_1 to SW_X for selection between the respective drains of the NMOS2_1 to the NMOS2_X and the control input terminal of the frequency dividing section 220. The constant α of proportionality is adjusted by adjusting the number x of switches turned on in a situation of actual use. An analog switch (for example an analog switch of a transfer gate configuration) is used as the switches SW_1 to SW_X. It suffices to set x to an arbitrary integer by a digital code, for example.

In the voltage-to-current converting circuit 253F in the sixth example, the outputs of the X NMOS2s can be added together by using the switches SW_1 to SW_X. $Idiv=(N \cdot x/M) \cdot Icco$, and Constant α of Proportionality=M/(N·x). The constant α of proportionality can be adjusted in a range of "x=1 to X." A minimum value of X is 1, in which case the switches are not necessary, and the sixth example is essentially the same as the first example.

Though not shown, a plurality of (X) NMOS1s (or PMOS1s: the following description will be made by taking the NMOS1s) may be provided on the side of the voltage-to-current converting section 254, switches SW_1 to SW_X for selection may be provided between the respective drains of the NMOS1_1 to the NMOS1_X and the control input terminal of the current controlled oscillator of the oscillating section 210, and the constant α of proportionality may be adjusted by adjusting the number x of switches turned on in a situation of actual use. In this case, $Idiv=(N/M \cdot x) \cdot Icco$, Constant α of Proportionality=(M·x)/N, and the constant α of proportionality can be adjusted in a range of "x=1 to X." A minimum value of X is 1, in which case the switches are not necessary, and the sixth example is essentially the same as the first example.

When the fifth example and the sixth example allowing the adjustment of the constant α of proportionality are compared with each other, the fifth example has a smaller circuit scale than the sixth example in that the adjustment of the constant α of proportionality is made possible by one NMOS2 or one PMOS2 (or one NMOS1 or one PMOS1). However, an ordinary device configuration needs to be changed for lead wiring to the switches SW_1 to SW_n (or switches SW_1 to SW_m) for selection. On the other hand, while the sixth example has a larger circuit scale because the number of NMOS2s or PMOS2s (or NMOS1s or PMOS1s) is increased, the sixth example has an advantage in that the constant α of proportionality can be set at a desired value by adjusting the number of NMOSs or PMOSs of the same configuration using NMOSs or PMOSs of the ordinary device configuration as they are.

Comparison with Comparative Example

Patent Document 1 proposes a mechanism that can accurately determine a state of operation of a phase-locked loop circuit and which achieves low power consumption. However, Patent Document 1 requires an analog/digital converter, a memory circuit, and a determining circuit to determine the state of operation of the phase-locked loop circuit accurately.

On the other hand, the mechanisms according to the present embodiments do not require an analog/digital converter, a memory circuit, or a determining circuit, have a simpler signal processing system than that of the mechanism of Patent Document 1, can reduce the possibility of occurrence of a difference in control response between the oscillation control signal for controlling the oscillator and the frequency division control signal for controlling the frequency divider, and can greatly reduce a circuit scale.

For example, the mechanisms according to the present embodiments, which obviate the need for an analog/digital converter, have advantages over the mechanism of Patent Document 1 in the following respects:

1) In a low-voltage process, it is generally difficult to design a high-precision analog/digital converter. Though depending on the configuration of the analog/digital converter, kickback noise attendant on conversion sampling can vary oscillation frequency, thus increasing so-called jitter. On the other hand, in the present embodiment, the analog/digital converter does not need to be used, and thus jitter can be ignored or reduced.

2) Because the analog/digital converter is rendered unnecessary, mounting area and power consumption can be greatly reduced.

In addition, in relation to changes in temperature and voltage, the mechanism of Patent Document 1 has drawbacks for the following reasons:

1) In the mechanism of Patent Document 1, the current of a feedback frequency divider is determined on the basis of a range of predetermined loop filter voltage. However, the current needs to be set at a lenient value with consideration given to effects of variation in oscillation frequency of an oscillating circuit with respect to the loop filter voltage, offsets of the analog/digital converter and a digital/analog converter, and the like. This means rough bias control for the feedback frequency divider. Erroneous operation tends to occur if the set value is made less lenient.

2) Because processing is performed using the analog/digital converter, the processing time of a certain latency is necessary, so that a difference in control response occurs between an oscillator system and a feedback frequency divider system. When the analog/digital converter is used, it is not possible to follow variations between conversion clock cycles due to operation in discrete time. This leads to an inability to perform optimum control in a pull-in process in which frequency changes greatly.

The mechanism of Patent Document 1 and the mechanisms according to the present embodiments are also different from each other in the following respects:

1) While the mechanism of Patent Document 1 is means for achieving an object of making "state determination with a certain threshold value," the mechanisms according to the present embodiments are intended to be able to follow an optimum state of operation (bias current value) dynamically and temporally continuously.

2) The mechanism of Patent Document 1 has a mechanism of adjustment from an analog signal (loop filter voltage) to analog/digital conversion to determination to digital/analog conversion (current control circuit) to bias current. The determination itself is made digitally, and is thus easy. However, because an analog/digital converter and a digital/analog converter are needed on the periphery of the determining circuit, errors in processes of conversion of the analog/digital converter and the digital/analog converter accumulate. To reduce conversion errors needs an increase in current value, which runs counter to an original object of reducing power consumption.

On the other hand, the current needed and consumed by the frequency divider control section 257 that generates the frequency division control signal CN_DIV for controlling the frequency dividing section 220 in the mechanisms according to the present embodiments can be said to be almost zero as compared with Patent Document 1. For example, the voltage-to-current converting circuit 253F in the sixth example can adjust the frequency division control current Idiv by N·x/M, thus imposing a very little burden on the original object of reducing power consumption.

In addition, Patent Document 1 proposes a mechanism for reducing power consumption in a feedback frequency divider in a fourth embodiment. However, the method uses a current control circuit 51 and controls the driving current of the feedback frequency dividing circuit on the basis of an external operation mode instruction signal. Therefore the mechanism of Patent Document 1 is totally different from the mechanisms according to the present embodiments.

With the mechanisms according to the present embodiments, the oscillating section 210 and the frequency dividing section 220 operate so as to be interlocked with each other by the control signals based on the loop filter voltage Vlf from the loop filter section 250 both in a pull-in process and at a time of locking. Therefore the driving current of the frequency dividing section 220 is automatically set to a current at the time of locking (which current is lower than at a time of Fosc_max) when the phase-locked loop circuit is locked to a desired frequency. It is thus unnecessary to control the driving current of the frequency dividing section 220 on the basis of an external operation mode instruction signal.

Incidentally, unlike Patent Document 1, the mechanisms according to the present embodiments are not intended for a purpose of "accurately determining a state of operation of the phase-locked loop circuit," and are not provided with a mechanism for that purpose. The mechanisms according to the present embodiments therefore cannot determine an operating region.

Example of Application to Electronic Devices

FIGS. 14A to 14E are diagrams of assistance in explaining an example of an electronic device to which the timing generating circuit 100 described in the foregoing embodiments (the oscillating section 210, the frequency dividing section 220, and the voltage-to-current converting circuit 253 in particular) is applied.

The reference timing generating section 110 using the phase-locked loop circuit described in the foregoing embodiments is effective as a PLL incorporated in an LSI (Large Scale Integrated Circuit) for a portable device, for example, which requires an advanced process and is desired to reduce power consumption. Of course, it is needless to say that the reference timing generating section 110 is not limited to portable devices.

Because a frequency divider that needs a bias current is mainly used in cases of high lock frequency, the reference timing generating section 110 is considered to be suitable for PCI Express for performing high-speed data interfacing, Serial ATA (SATA, Serial Advanced Technology Attachment), DDR2 and DDR3 for SDRAM (Synchronous Dynamic Random Access Memory), and the like.

For example, the oscillating section 210, the frequency dividing section 220, and the voltage-to-current converting circuit 253 described in the foregoing embodiments are expected to be applied in cases where a high-speed data transfer is required in various electronic devices including portable devices such as game machines, electronic books, electronic dictionaries, portable telephones and the like and, without being limited to portable devices, image display devices and the like.

Figure 14A:
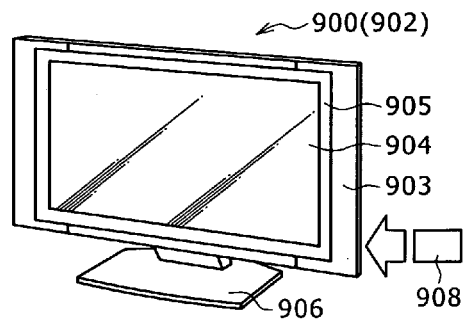
FIGS. 14A, 14B, 14C, 14D, and 14E are diagrams of assistance in explaining an example of an electronic device to which the oscillating section, the frequency dividing section, and the voltage-to-current converting circuit according to the present embodiment are applied.

For example, FIG. 14A is a diagram showing an example of an external appearance in a case where an electronic device 900 is a television receiver 902 using a display module 904 (a liquid crystal display device or an organic EL display device)

as an example of an image display device. The television receiver 902 has a structure in which the display module 904 is disposed in a front surface of a front panel 903 supported by a base 906. A filter glass 905 is provided in a display surface. The television receiver 902 uses an SDRAM (DDR2 specifications or DDR3 specifications) not shown in FIG. 14A. The mechanisms according to the foregoing embodiments are applied to generation of a clock for a data interface. In addition, the television receiver 902 is configured to allow a hard disk device 908 of the Serial ATA system for a recording function to be attached and detached to and from the television receiver 902. The mechanisms according to the foregoing embodiments are applied to generation of a clock for a data interface of the hard disk device 908.

Figure 14B:
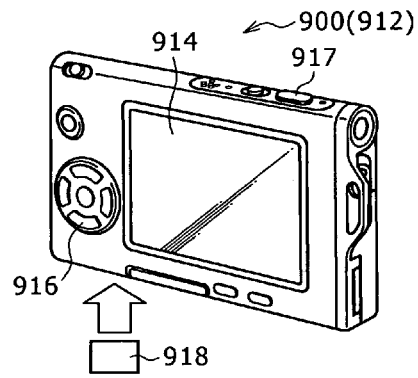

FIG. 14B is a diagram showing an example of an external appearance in a case where the electronic device 900 is a digital camera 912. The digital camera 912 includes a display module 914, a control switch 916, a shutter button 917, and the like. The digital camera 912 is configured to allow a memory card 918 to be attached and detached to and from the digital camera 912. The mechanisms according to the foregoing embodiments are applied to generation of a clock for a data interface of the memory card 918.

Figure 14C:
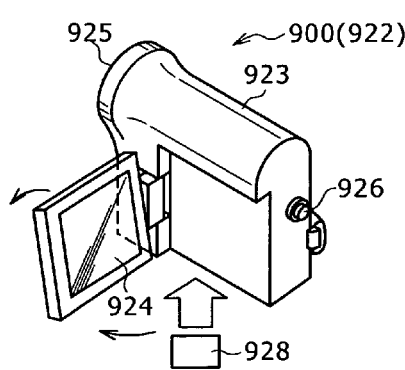

FIG. 14C is a diagram showing an example of an external appearance in a case where the electronic device 900 is a video camera 922. The video camera 922 has an image pickup lens 925 for picking up an image of a subject in the front of a body 923, and further includes a display module 924, a photographing start/stop switch 926, and the like. The video camera 922 is configured to allow a hard disk device 928 of the Serial ATA system to be attached and detached to and from the video camera 922. The mechanisms according to the foregoing embodiments are applied to generation of a clock for a data interface of the hard disk device 928.

Figure 14D:
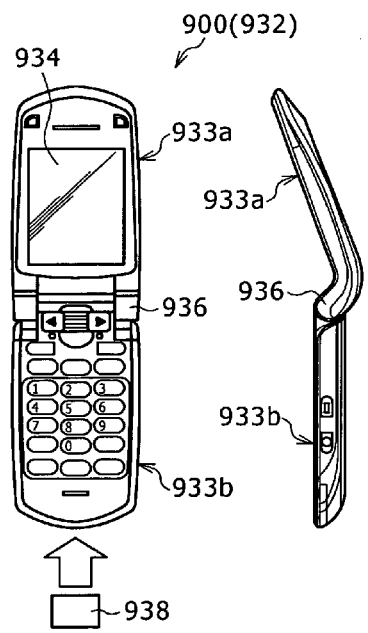

FIG. 14D is a diagram showing an example of an external appearance in a case where the electronic device 900 is a portable telephone 932. The portable telephone 932 is of a folding type. The portable telephone 932 includes an upper side casing 933*a*, a lower side casing 933*b*, a display module 934, a coupling part 936 (a hinge part in this case), and the like. The portable telephone 932 is configured to allow a memory card 938 to be attached and detached to and from the portable telephone 932. The mechanisms according to the foregoing embodiments are applied to generation of a clock for a data interface of the memory card 938.

Figure 14E:
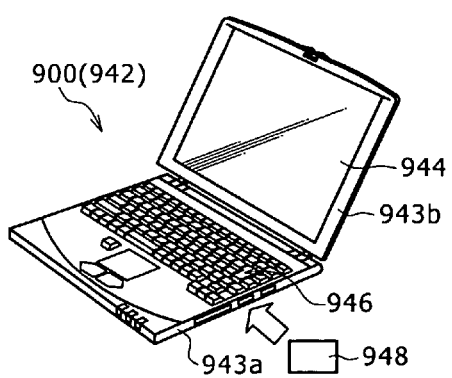

FIG. 14E is a diagram showing an example of an external appearance in a case where the electronic device 900 is a computer 942. The computer 942 includes an upper side casing 943*a*, a lower side casing 943*b*, a display module 944, a keyboard 946, and the like. The computer 942 has a bus complying with the PCI Express specifications, and uses an SDRAM (DDR2 specifications or DDR3 specifications) not shown in FIG. 14E and a hard disk device of the Serial ATA system. The mechanisms according to the foregoing embodiments are applied to generation of a clock for a data interface of the SDRAM and the hard disk device. In addition, the computer 942 is configured to allow portable type storage media 948 (for example a USB memory) complying with various specifications to be attached and detached to and from the computer 942. The mechanisms according to the foregoing embodiments are applied to generation of a clock for a data interface of the storage media 948.

While the present invention has been described above using embodiments thereof, the technical scope of the present invention is not limited to that described in the foregoing embodiments. Various changes and improvements can be made to the foregoing embodiments without departing from the spirit of the invention, and forms obtained by adding such changes and improvements are also included in the technical scope of the present invention.

In addition, the foregoing embodiments do not limit inventions of claims, and not all combinations of features described in the embodiments are necessarily essential to solving means of the invention. The foregoing embodiments include inventions in various stages, and various inventions can be extracted by appropriately combining a plurality of disclosed constitutional requirements. Even when a few constitutional requirements are omitted from all the constitutional requirements disclosed in the embodiments, constitutions resulting from the omission of the few constitutional requirements can be extracted as inventions as long as an effect is obtained.

The present application contains subject matter related to that disclosed in Japanese Priority Patent Application JP 2010-050513 filed in the Japan Patent Office on Mar. 8, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A phase-locked loop circuit comprising:
a phase and frequency comparing section configured to compare a phase of an external reference clock signal with a phase of a comparison clock signal, and generate an error signal corresponding to a result of comparison;
an oscillating section configured to generate an internal clock signal of an oscillation frequency corresponding to said error signal;
a frequency dividing section configured to generate said comparison clock signal by frequency-dividing said internal clock signal by a predetermined frequency dividing ratio;
an oscillator control section configured to generate an oscillation control signal for controlling frequency of said internal clock signal output from said oscillating section on a basis of said error signal; and
a frequency divider control section configured to generate a frequency division control signal for controlling a bias current of said frequency dividing section on a basis of said error signal;
wherein said oscillator control section and said frequency divider control section are configured such that said oscillation control signal and said frequency division control signal respond having a predetermined relation to each other on a basis of said error signal both in a pull-in process and at a time of locking.

2. The phase-locked loop circuit according to claim 1, wherein said oscillator control section and said frequency divider control section are configured such that control response of said oscillation control signal and control response of said frequency division control signal, the control response of said oscillation control signal and the control response of said frequency division control signal being based on said error signal, have a predetermined correlation to each other both in the pull-in process and at the time of locking.

3. The phase-locked loop circuit according to claim 2, wherein said oscillator control section and said frequency divider control section are configured such that the control response of said oscillation control signal and the control response of said frequency division control signal, the control response of said oscillation control signal and the control response of said frequency division control signal being based on said error signal, have a linear relation to each other both in the pull-in process and at the time of locking.

4. A phase-locked loop circuit comprising:
a phase and frequency comparing section configured to compare a phase of an external reference clock signal with a phase of a comparison clock signal, and generate an error signal corresponding to a result of comparison;
an oscillating section configured to generate an internal clock signal of an oscillation frequency corresponding to said error signal;
a frequency dividing section configured to generate said comparison clock signal by frequency-dividing said internal clock signal by a predetermined frequency dividing ratio;
an oscillator control section configured to generate an oscillation control signal for controlling frequency of said internal clock signal output from said oscillating section on a basis of said error signal; and
a frequency divider control section configured to generate a frequency division control signal for controlling a bias current of said frequency dividing section on a basis of said error signal;
wherein said oscillator control section and said frequency divider control section are configured such that said oscillating section and said frequency dividing section perform interlocked operation on a basis of said error signal both in a pull-in process and at a time of locking.

5. The phase-locked loop circuit according to claim 1, wherein said oscillator control section and said frequency divider control section sets relation between the respective control signals such that a maximum operating frequency of said frequency dividing section, the maximum operating frequency corresponding to an arbitrary value of said error signal both in the pull-in process and at the time of locking, is always higher than frequency of said internal clock signal output from said oscillating section.

6. The phase-locked loop circuit according to claim 1, wherein said frequency divider control section is configured such that said frequency division control signal at the time of locking sets, in said frequency dividing section, a bias current lower than a bias current based on said error signal corresponding to a maximum frequency of said internal clock signal output from said oscillating section in the pull-in process.

7. The phase-locked loop circuit according to claim 1, wherein said oscillating section is configured to operate on a basis of said oscillation control signal in a current mode,
said frequency dividing section is configured to operate on a basis of said frequency division control signal in the current mode, and
said oscillator control section and said frequency divider control section are configured to generate the respective control signals in the current mode by current copy operation on a basis of said error signal.

8. The phase-locked loop circuit according to claim 7, further comprising a current source section configured to generate a current signal by source degeneration on a basis of said error signal,
wherein said oscillator control section and said frequency divider control section are configured to generate the respective control signals in the current mode by the current copy operation on a basis of the current signal generated by said current source section.

9. The phase-locked loop circuit according to claim 8, wherein said current source section is configured to compare said error signal with the generated said current signal and perform feedback operation.

10. The phase-locked loop circuit according to claim 7, wherein said oscillator control section and said frequency divider control section have a current source section configured to generate a current on a basis of said error signal, and
at least one of said oscillator control section and said frequency divider control section has a plurality of said current source sections of an identical configuration, and are configured to generate said control signal by a combination of current signals generated in the respective current source sections.

11. The phase-locked loop circuit according to claim 7, wherein said oscillator control section and said frequency divider control section have a transistor element for generating a current on a basis of said error signal, and
at least one of said oscillator control section and said frequency divider control section
  includes a switch connected to each finger of said transistor element,
  is configured such that an opposite side of said switch from said finger is connected to a common connection point, and a current on a side of the common connection point is set as said control signal, and
  is configured such that magnitude of said control signal is adjustable by adjusting a number of switches turned on.

12. The phase-locked loop circuit according to claim 7, wherein said oscillator control section and said frequency divider control section have a current source section configured to generate a current on a basis of said error signal, and
at least one of said oscillator control section and said frequency divider control section
  includes a plurality of said current source sections of an identical configuration,
  includes a switch connected to an output of each current source section,
  is configured such that an opposite side of said switch from said current source section is connected to a common connection point, and a current on a side of the common connection point is set as said control signal, and
  is configured such that magnitude of said control signal is adjustable by adjusting a number of switches turned on.

13. A semiconductor integrated circuit comprising:
a phase and frequency comparing section configured to compare a phase of an external reference clock signal with a phase of a comparison clock signal, and generate an error signal corresponding to a result of comparison,
an oscillating section configured to generate an internal clock signal of an oscillation frequency corresponding to said error signal, a frequency dividing section configured to generate said comparison clock signal by frequency-dividing said internal clock signal by a predetermined frequency dividing ratio, an oscillator control section configured to generate an oscillation control signal for controlling frequency of said internal clock signal output from said oscillating section on a basis of said error signal, and a frequency divider control section configured to generate a frequency division control signal for controlling a bias current of said frequency dividing section on a basis of said error signal; and a signal processing section configured to operate on a basis of said internal clock signal;

wherein said oscillator control section and said frequency divider control section are configured such that said oscillation control signal and said frequency division control signal respond having a predetermined relation to each other on a basis of said error signal both in a pull-in process and at a time of locking, or said oscillator control section and said frequency divider control section are configured such that said oscillating section and said frequency dividing section perform interlocked operation on a basis of said error signal both in a pull-in process and at a time of locking.

14. An electronic device comprising:

a phase and frequency comparing section configured to compare a phase of an external reference clock signal with a phase of a comparison clock signal, and generate an error signal corresponding to a result of comparison, an oscillating section configured to generate an internal clock signal of an oscillation frequency corresponding to said error signal, a frequency dividing section configured to generate said comparison clock signal by frequency-dividing said internal clock signal by a predetermined frequency dividing ratio, an oscillator control section configured to generate an oscillation control signal for controlling frequency of said internal clock signal output from said oscillating section on a basis of said error signal, and a frequency divider control section configured to generate a frequency division control signal for controlling a bias current of said frequency dividing section on a basis of said error signal; and a signal processing section configured to operate on a basis of said internal clock signal;

wherein said oscillator control section and said frequency divider control section are configured such that said oscillation control signal and said frequency division control signal respond having a predetermined relation to each other on a basis of said error signal both in a pull-in process and at a time of locking, or said oscillator control section and said frequency divider control section are configured such that said oscillating section and said frequency dividing section perform interlocked operation on a basis of said error signal both in a pull-in process and at a time of locking.

15. A control method of a phase-locked loop circuit, said control method comprising the steps of:

comparing a phase of an external reference clock signal with a phase of a comparison clock signal, and generating an error signal corresponding to a result of comparison;

generating an internal clock signal of an oscillation frequency corresponding to said error signal;

generating said comparison clock signal by frequency-dividing said internal clock signal by a predetermined frequency dividing ratio;

generating an oscillation control signal for controlling frequency of said internal clock signal on a basis of said error signal; and generating a frequency division control signal for controlling a bias current of a circuit performing said frequency dividing on a basis of said error signal;

wherein said oscillation control signal and said frequency division control signal are made to respond having a predetermined relation to each other on a basis of said error signal both in a pull-in process and at a time of locking.

16. A control method of a phase-locked loop circuit, said control method comprising the steps of:

comparing a phase of an external reference clock signal with a phase of a comparison clock signal, and generating an error signal corresponding to a result of comparison;

generating an internal clock signal of an oscillation frequency corresponding to said error signal;

generating said comparison clock signal by frequency-dividing said internal clock signal by a predetermined frequency dividing ratio;

generating an oscillation control signal for controlling frequency of said internal clock signal on a basis of said error signal; and generating a frequency division control signal for controlling a bias current of a circuit performing said frequency dividing on a basis of said error signal;

wherein the step of generating said internal clock signal and the step of generating said comparison clock signal are operated so as to be interlocked with each other on a basis of said error signal both in a pull-in process and at a time of locking.

17. A phase-locked loop circuit comprising:

phase and frequency comparing means for comparing a phase of an external reference clock signal with a phase of a comparison clock signal, and generating an error signal corresponding to a result of comparison;

oscillating means for generating an internal clock signal of an oscillation frequency corresponding to said error signal;

frequency dividing means for generating said comparison clock signal by frequency-dividing said internal clock signal by a predetermined frequency dividing ratio;

oscillator control means for generating an oscillation control signal for controlling frequency of said internal clock signal output from said oscillating means on a basis of said error signal; and frequency divider control means for generating a frequency division control signal for controlling a bias current of said frequency dividing means on a basis of said error signal;

wherein said oscillator control means and said frequency divider control means are configured such that said oscillation control signal and said frequency division control signal respond having a predetermined relation to each other on a basis of said error signal both in a pull-in process and at a time of locking.

18. A phase-locked loop circuit comprising:

phase and frequency comparing means for comparing a phase of an external reference clock signal with a phase of a comparison clock signal, and generating an error signal corresponding to a result of comparison;

oscillating means for generating an internal clock signal of an oscillation frequency corresponding to said error signal;

frequency dividing means for generating said comparison clock signal by frequency-dividing said internal clock signal by a predetermined frequency dividing ratio;

oscillator control means for generating an oscillation control signal for controlling frequency of said internal clock signal output from said oscillating means on a basis of said error signal; and frequency divider control means for generating a frequency division control signal for controlling a bias current of said frequency dividing means on a basis of said error signal;

wherein said oscillator control means and said frequency divider control means are configured such that said oscillating means and said frequency dividing means perform interlocked operation on a basis of said error signal both in a pull-in process and at a time of locking.

19. A semiconductor integrated circuit comprising:

phase and frequency comparing means for comparing a phase of an external reference clock signal with a phase of a comparison clock signal, and generating an error signal corresponding to a result of comparison, oscillating means for generating an internal clock signal of an oscillation frequency corresponding to said error signal, frequency dividing means for generating said comparison clock signal by frequency-dividing said internal clock signal by a predetermined frequency dividing ratio, oscillator control means for generating an oscillation control signal for controlling frequency of said internal clock signal output from said oscillating means on a basis of said error signal, and frequency divider control means for generating a frequency division control signal for controlling a bias current of said frequency dividing means on a basis of said error signal; and signal processing means for operating on a basis of said internal clock signal;

wherein said oscillator control means and said frequency divider control means are configured such that said oscillation control signal and said frequency division control signal respond having a predetermined relation to each other on a basis of said error signal both in a pull-in process and at a time of locking, or said oscillator control means and said frequency divider control means are configured such that said oscillating means and said frequency dividing means perform interlocked operation on a basis of said error signal both in a pull-in process and at a time of locking.

20. An electronic device comprising:

phase and frequency comparing means for comparing a phase of an external reference clock signal with a phase of a comparison clock signal, and generating an error signal corresponding to a result of comparison, oscillating means for generating an internal clock signal of an oscillation frequency corresponding to said error signal, frequency dividing means for generating said comparison clock signal by frequency-dividing said internal clock signal by a predetermined frequency dividing ratio, oscillator control means for generating an oscillation control signal for controlling frequency of said internal clock signal output from said oscillating means on a basis of said error signal, and frequency divider control means for generating a frequency division control signal for controlling a bias current of said frequency dividing means on a basis of said error signal; and signal processing means for operating on a basis of said internal clock signal;

wherein said oscillator control means and said frequency divider control means are configured such that said oscillation control signal and said frequency division control signal respond having a predetermined relation to each other on a basis of said error signal both in a pull-in process and at a time of locking, or said oscillator control means and said frequency divider control means are configured such that said oscillating means and said frequency dividing means perform interlocked operation on a basis of said error signal both in a pull-in process and at a time of locking.

* * * * *